(12) United States Patent
Ahn et al.

(10) Patent No.: US 11,511,363 B2
(45) Date of Patent: Nov. 29, 2022

(54) BALL JUMPING APPARATUS AND BALL ABSORPTION

(71) Applicant: Samsung Electronics Co., Ltd., Suwon-si (KR)

(72) Inventors: Sangkeun Ahn, Hwaseong-si (KR); Hyeji Shin, Anyang-si (KR); Dongsoo Lee, Cheonan-si (KR); Sangho Jang, Cheonan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 17/216,922

(22) Filed: Mar. 30, 2021

(65) Prior Publication Data

US 2022/0023963 A1 Jan. 27, 2022

(30) Foreign Application Priority Data

Jul. 24, 2020 (KR) .................. 10-2020-0092446

(51) Int. Cl.
*B23K 3/06* (2006.01)
*B06B 1/10* (2006.01)
*H01L 23/00* (2006.01)

(52) U.S. Cl.
CPC .............. *B23K 3/0661* (2013.01); *B06B 1/10* (2013.01); *B23K 3/063* (2013.01); *H01L 24/742* (2013.01); *H01L 2224/75601* (2013.01)

(58) Field of Classification Search
CPC . H01L 2224/75601; H01L 2224/75611; H01L 24/742; B23K 3/0623
See application file for complete search history.

(56) References Cited

U.S. PATENT DOCUMENTS

| 5,445,313 | A | * | 8/1995 | Boyd .................. H05K 13/0465 228/248.1 |
| 5,601,229 | A | * | 2/1997 | Nakazato ................ H01L 24/11 438/615 |
| 5,657,528 | A | | 8/1997 | Sakemi et al. |
| 6,176,008 | B1 | * | 1/2001 | Ueoka .................. B23K 3/0623 269/21 |

(Continued)

FOREIGN PATENT DOCUMENTS

| JP | 08-162495 | * | 6/1996 |
| JP | 3132301 B | | 2/2001 |

(Continued)

*Primary Examiner* — Kiley S Stoner
*Assistant Examiner* — Carlos J Gamino
(74) *Attorney, Agent, or Firm* — Harness, Dickey & Pierce, P.L.C.

(57) ABSTRACT

Disclosed are ball jumping apparatuses and ball absorption methods using the same. The ball jumping apparatus comprises a fixing part, a moving part spaced apart from the fixing part, and a resilient member that connects the fixing part and the moving part to each other. The resilient member extends upwardly from the fixing part and has a connection with the moving part. The fixing part includes a fixing plate that spreads in a horizontal direction. The moving part includes an oscillating vessel that has a ball receiving space in which a ball is received, and an oscillator coupled to the oscillating vessel. A bottom surface of the oscillating vessel is upwardly spaced apart from a top surface of the fixing plate.

9 Claims, 20 Drawing Sheets

(56) References Cited

U.S. PATENT DOCUMENTS

| | | | |
|---|---|---|---|
| 6,607,118 B2 | 8/2003 | Cheng et al. | |
| 7,475,803 B2 | 1/2009 | Sumita et al. | |
| 7,506,792 B1 * | 3/2009 | Manfroy | B23K 3/082 |
| | | | 228/41 |
| 7,644,853 B2 | 1/2010 | Cobbley et al. | |
| 7,703,662 B2 | 4/2010 | Iida et al. | |
| 7,866,529 B2 | 1/2011 | Sumita et al. | |
| 8,104,663 B2 | 1/2012 | Ishikawa et al. | |
| 2008/0296355 A1 * | 12/2008 | Costales | B23K 3/0623 |
| | | | 228/8 |
| 2017/0129032 A1 * | 5/2017 | Kim | B23K 1/0016 |
| 2017/0165772 A1 | 6/2017 | Azdasht | |

FOREIGN PATENT DOCUMENTS

| | | | |
|---|---|---|---|
| KR | 10-1760206 | * | 2/2005 |
| KR | 100540597 B1 | | 1/2006 |
| KR | 10-2007-0056337 A | | 6/2007 |
| KR | 10-2011-0107663 A | | 10/2011 |
| KR | 101420666 B1 | | 7/2014 |
| KR | 101760206 B1 | | 7/2017 |
| KR | 101870951 B1 | | 6/2018 |

* cited by examiner

BALL JUMPING APPARATUS AND BALL ABSORPTION

CROSS-REFERENCE TO RELATED APPLICATION

This U.S. non-provisional application claims priority under 35 U.S.C § 119 to Korean Patent Application No. 10-2020-0092446 filed on Jul. 24, 2020 in the Korean Intellectual Property Office, the disclosure of which is hereby incorporated by reference in its entirety.

BACKGROUND

The present inventive concepts relate to a ball jumping apparatus and/or a ball absorption method. For example, at least some example embodiments relate to a ball jumping apparatus configured to uniformly absorb balls onto a ball absorption apparatus and/or a ball absorption method using the same.

A semiconductor package is provided to implement an integrated circuit chip to qualify for use in electronic products. In general, the semiconductor package may be fabricated by mounting a semiconductor chip on a substrate such as a printed circuit board (PCB). A solder ball may be used to electrically connect an internal circuit of a substrate to the outside. The solder ball may be electrically connected to a pad formed and exposed on a surface of the substrate. With the development of electronic industry, electronic products have increasingly demands for high performance, high speed, and compact size. This trend causes the solder ball to have a fine size.

SUMMARY

Some example embodiments of the present inventive concepts provide a ball jumping apparatus configured to uniformly absorb balls onto a ball absorption apparatus and/or a ball absorption method using the same.

Some example embodiments of the present inventive concepts provide a ball jumping apparatus capable of controlling movement of balls in an oscillating vessel and/or a ball absorption method using the same.

Some example embodiments of the present inventive concepts provide a ball jumping apparatus capable of inhibiting (or, alternatively, preventing) damage to a ball absorption apparatus and/or a ball absorption method using the same.

Some example embodiments of the present inventive concepts provide a ball jumping apparatus capable of reducing working hours and/or a ball absorption method using the same.

An object of the present inventive concepts is not limited to the mentioned above, and other objects which have not been mentioned above will be clearly understood to those skilled in the art from the following description.

According to some example embodiments of the present inventive concepts, a ball jumping apparatus may include a fixing part including a fixing plate extending in a horizontal direction; a moving part including an oscillating vessel and an oscillator coupled to the oscillating vessel, the moving part being spaced apart from the fixing part with a gap between a bottom surface of the oscillating vessel and a top surface of the fixing plate, the oscillating vessel configured to receive a ball in a ball receiving space thereof; and a resilient member configured to extend upward from the fixing part to connect the fixing part and the moving part.

According to some example embodiments of the present inventive concepts, a ball jumping apparatus may include a fixing part includes a spacing plate that extends upwardly; a moving part including an oscillating vessel and an oscillator coupled to the oscillating vessel, the moving part being spaced apart from the fixing part, the oscillating vessel configured to receive a ball in a ball receiving space thereof; and a resilient member extending in a horizontal direction from the spacing plate to a lateral surface of the oscillating vessel to connect the fixing part and the moving part.

According to some example embodiments of the present inventive concepts, a ball absorption method may include aligning a ball absorption apparatus onto a ball jumping apparatus, the ball jumping apparatus including an oscillating vessel configured to receive a ball therein; controlling a vacuum pump to create a vacuum pressure within the ball absorption apparatus; and controlling an oscillator of the ball jumping apparatus to vibrate at a first frequency and to vibrate at a second frequency subsequent to vibrating at the first frequency to stimulate the ball in the oscillating vessel.

Details of other example embodiments are included in the description and drawings.

DETAILED DESCRIPTION

Figure 1:
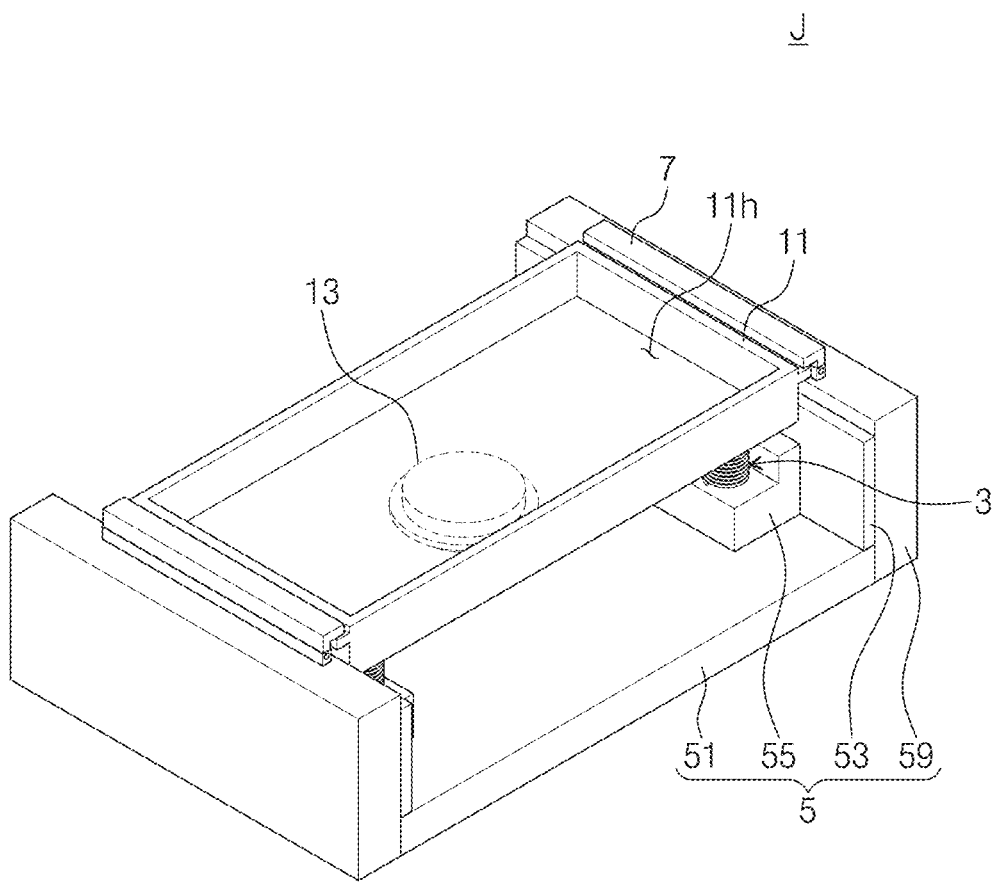
FIG. 1 illustrates a perspective view showing a ball jumping apparatus according to some example embodiments of the present inventive concepts.

The following will now describe some example embodiments of the present inventive concepts with reference to the accompanying drawings. Like reference numerals may indicate like components throughout the description.

Figure 2:
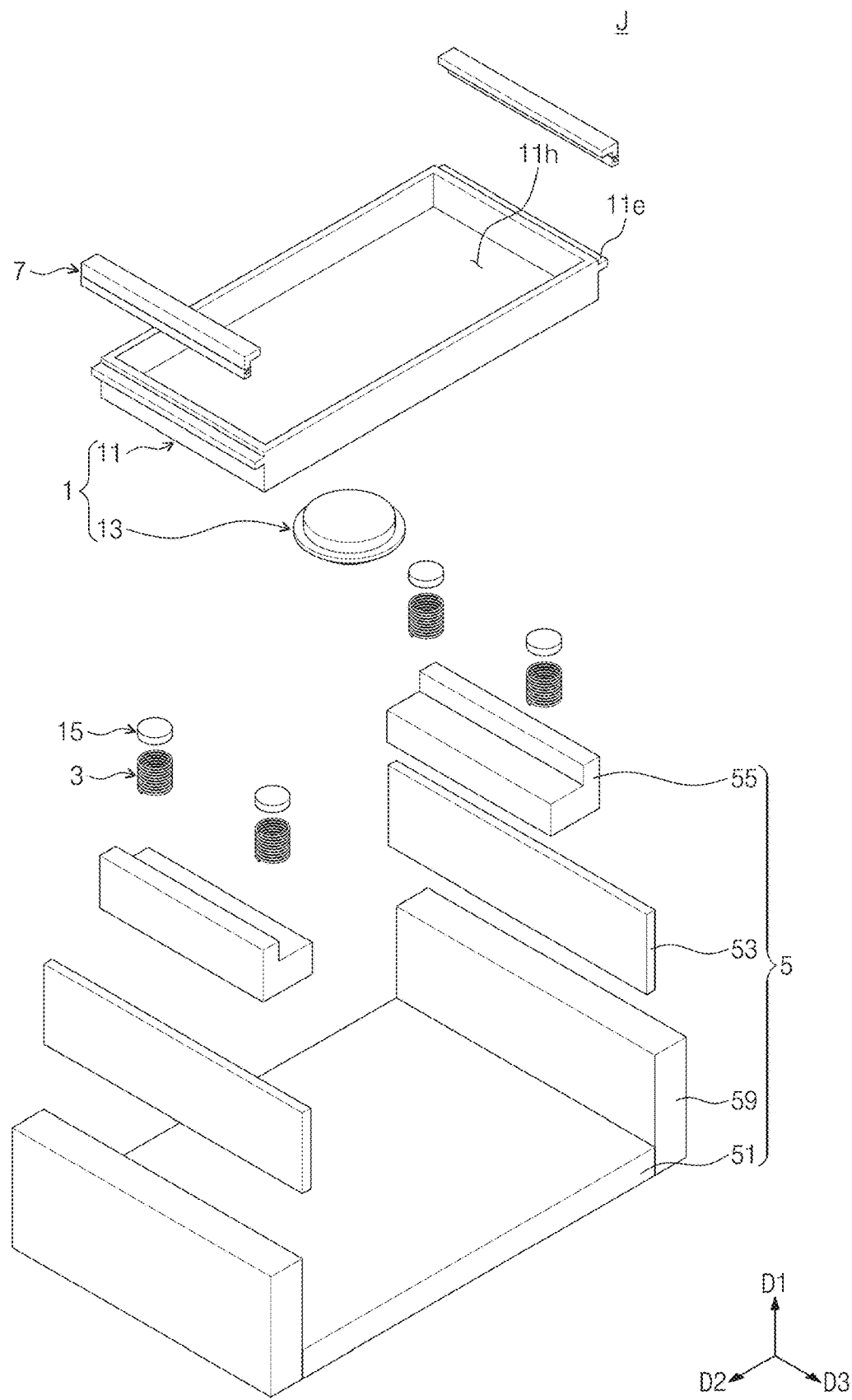
FIG. 2 illustrates an exploded perspective view showing a ball jumping apparatus according to some example embodiments of the present inventive concepts.
Figure 3:
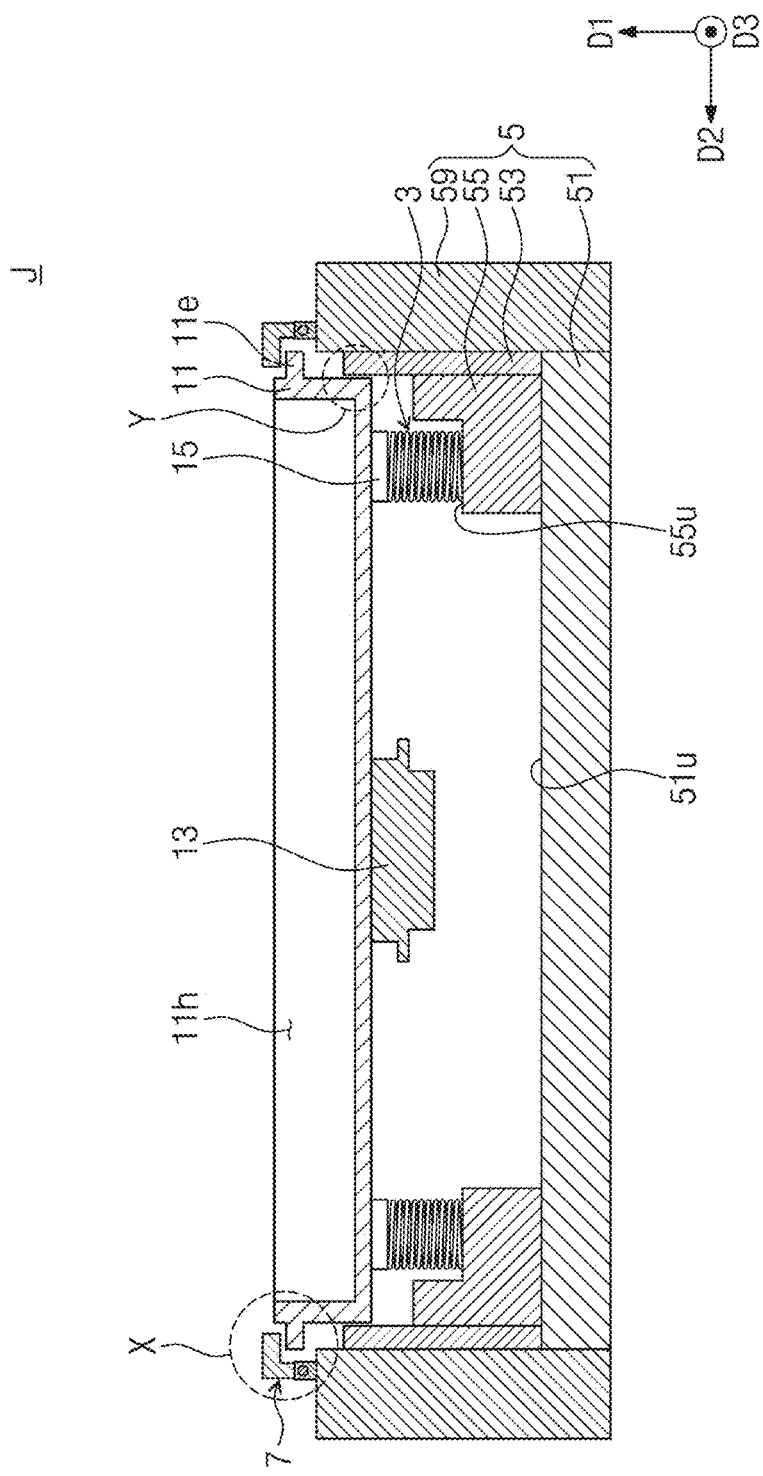
FIG. 3 illustrates a cross-sectional view showing a ball jumping apparatus according to some example embodiments of the present inventive concepts.

FIG. 1 illustrates a perspective view showing a ball jumping apparatus according to some example embodiments of the present inventive concepts. FIG. 2 illustrates an exploded perspective view showing a ball jumping apparatus according to some example embodiments of the present inventive concepts. FIG. 3 illustrates a cross-sectional view showing a ball jumping apparatus according to some example embodiments of the present inventive concepts.

In this description below, symbols D1, D2, and D3 of FIG. 1 may be respectively called a first direction, a second direction, and a third direction substantially perpendicular to the first and second directions.

Referring to FIGS. 1 to 3, a ball jumping apparatus J may include a moving part 1, a resilient member 3, a fixing part 5, and a locking tool 7.

The moving part 1 may be connected through the resilient member 3 to the fixing part 5. The moving part 1 may be spaced apart from the fixing part 5. For example, under a state that no force is applied to the resilient member 3, the moving part 1 may not be in contact with the fixing part 5. In this case, the resilient member 3 may allow the moving part 1 to float from the fixing part 5. The moving part 1 may include an oscillating vessel 11, an oscillator 13, and a connecting member 15.

The oscillating vessel 11 may have a ball receiving space 11h. The ball receiving space 11h may be provided to accommodate a solder ball (see Sb of FIG. 8). The ball receiving space 11h may be opened at its top side. For example, the ball receiving space 11h may have an exposed top side. The solder ball Sb may be disposed in the ball receiving space 11h, and may then bounce upwardly by vibration of the oscillating vessel 11. A detailed description thereof will be further discussed below. The oscillating vessel 11 may be generally shaped like a rectangular hexahedron. The ball receiving space 11h may mean a space formed by being recessed downwardly from a top surface of the rectangular hexahedron. The present inventive concepts, however, are not limited thereto, and the oscillating vessel 11 may have any suitable shape that has a space capable of receiving the solder ball Sb. The oscillating vessel 11 may include a rigid material. For example, the oscillating vessel 11 may include a metallic material. For more detail, the oscillating vessel 11 may include aluminum (Al). The oscillating vessel 11 may be spaced apart from the fixing part 5. For example, a bottom surface of the oscillating vessel 11 may be spaced apart in the first direction D1 from a top surface 51u of a fixing plate 51. The fixing part 5 may not restrict movement of the oscillating vessel 11. For example, the oscillating vessel 11 may not be in contact with any components other than the resilient member 3 and the oscillator 13. The oscillating vessel 11 may further include a flange 11e. The flange 11e may outwardly extend from a lateral surface of the oscillating vessel 11. For example, the flange 11e may outwardly extend from each of opposite lateral surfaces of the oscillating vessel 11.

The oscillator 13 may be coupled to the oscillating vessel 11. The oscillator 13 may vibrate in response to a power that is externally supplied or internally supplied from the oscillator 13. The oscillator 13 may vibrate at a low frequency. For example, the oscillator 13 may vibrate at a frequency of about 20 Hz to about 100 Hz. A detailed description thereof will be further discussed below. The oscillator 13 may be located at various positions of the oscillating vessel 11. For example, as shown in FIG. 3, the oscillator 13 may be connected to the bottom surface of the oscillating vessel 11. The oscillator 13 may be spaced apart from the fixing part 5. Therefore, the oscillator 13 may not be in contact with the fixing part 5. For example, the oscillator 13 may be upwardly spaced apart from the fixing plate 51. For more detail, the oscillator 13 may be spaced apart in the first direction D1 from the top surface 51u of the fixing plate 51. Therefore, the oscillator 13 may not be in contact with the fixing plate 51. The oscillator 13 may not be in contact with any components other than the oscillating vessel 11. When the oscillator 13 vibrates, the oscillating vessel 11 may also vibrate.

The connecting member 15 may be coupled to the bottom surface of the oscillating vessel 11. The connecting member 15 may connect the oscillating vessel 11 and the resilient member 3 to each other. The connecting member 15 may allow the resilient member 3 to have a connection with the bottom surface of the oscillating vessel 11.

The resilient member 3 may be coupled to the moving part 1. The resilient member 3 may connect the moving part 1 and the fixing part 5 to each other. The resilient member 3 may allow the moving part 1 to rest in a position spaced apart from the fixing part 5. In this case, the resilient member 3 may allow the moving part 1 to float from the fixing part 5. The resilient member 3 may be compressible up and down. In some example embodiments, the resilient member 3 may include a coil spring or the like. The present inventive concepts, however, are not limited thereto, and the resilient member 3 may have any elastic configuration capable of being compressible up and down. The resilient member 3 may be coupled to the bottom surface of the oscillating vessel 11. For example, the resilient member 3 may be connected through the connecting member 15 to the bottom surface of the oscillating vessel 11. The resilient member 3 may be combined with the fixing part 5. For example, the resilient member 3 may be joined with the fixing plate 51. For more detail, the resilient member 3 may be connected through a resilient member fastener 55 to the fixing plate 51. The resilient member 3 may upwardly extend from a top surface 55u of the resilient member fastener 55, thereby being coupled to the connecting member 15. The resilient member 3 may be provided in plural. For example, four resilient members 3 may be provided. The four resilient members 3 may be spaced apart from each other in the second direction D2 and the third direction D3. For convenience of description, a single resilient member 3 will be discussed below.

The fixing part 5 may be fixed to a specific position. The fixing part 5 may be spaced apart from the moving part 1. The fixing part 5 may not be in contact with the moving part 1. The fixing part 5 may include the fixing plate 51, a spacing plate 53, the resilient member fastener 55, and a supporter 59.

The fixing plate 51 may spread in a horizontal direction. For example, the fixing plate 51 may have a plate shape that extends in the second direction D2 and the third direction D3. The fixing plate 51 may be downwardly spaced apart from the oscillating vessel 11. For example, the top surface 51u of the fixing plate 51 may be downwardly spaced apart from the bottom surface of the oscillating vessel 11. In addition, the fixing plate 51 may be downwardly spaced apart from the oscillator 13. For example, the top surface 51u of the fixing plate 51 may be downwardly spaced apart from the oscillator 13. The spacing plate 53 and the resilient member fastener 55 may be positioned on the fixing plate 51.

The spacing plate 53 may upwardly extend from the fixing plate 51. For example, the spacing plate 53 may have a plate shape that extends in a vertical direction. The spacing plate 53 may be spaced apart in a horizontal direction from the lateral surface of the oscillating vessel 11. A detailed description thereof will be further discussed below with reference to FIG. 5. The spacing plate 53 may be provided in plural. For example, two spacing plates 53 may be provided spaced apart from each other in the second direction D2. For convenience of description, a single spacing plate 53 will be discussed below.

The resilient member fastener 55 may be positioned on the fixing plate 51. The resilient member 3 may be coupled to the top surface 55u of the resilient member fastener 55. The resilient member 3 may connect the resilient member fastener 55 and the oscillating vessel 11 to each other. In some example embodiments, the resilient member fastener 55 may be provided in plural. For example, two resilient member fasteners 55 may be provided spaced apart from each other in the second direction D2. For convenience of description, a single resilient member fastener 55 will be discussed below.

The supporter 59 may extend in a vertical direction. The supporter 59 may support the locking tool 7. The supporter 59 may be provided in plural. For example, two supporters 59 may be provided spaced apart from each other in the second direction D2. For convenience of description, a single supporter 59 will be discussed below.

The locking tool 7 may be coupled to the supporter 59. A portion of the locking tool 7 may be positioned on the flange 11e of the oscillating vessel 11. A detailed description thereof will be further discussed below with reference to FIG. 4.

Figure 4:
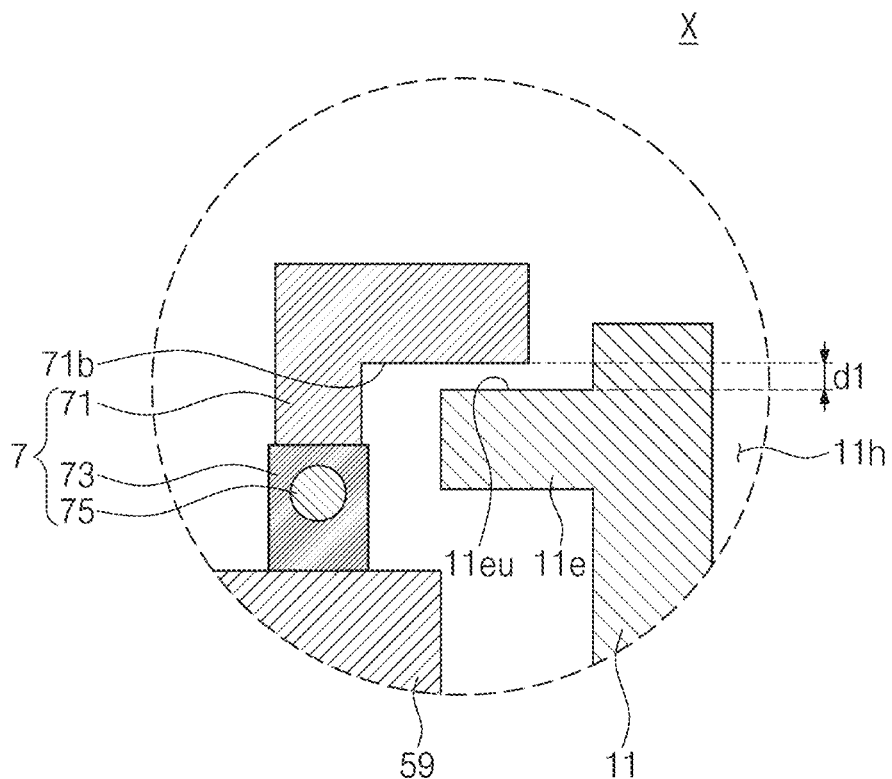
FIG. 4 illustrates an enlarged view showing section X of FIG. 3.

FIG. 4 illustrates an enlarged view showing section X of FIG. 3.

Referring to FIG. 4, the locking tool 7 may be positioned on the supporter 59. The locking tool 7 may include a connecting member 73, a limiting member 71, and a hinge 75. The connecting member 73 may be coupled to the supporter 59. The connecting member 73 may connect the limiting member 71 to the supporter 59. The limiting member 71 may be rotatably coupled to the connecting member 73. The limiting member 71 may rotate with respect to the connecting member 73 about the hinge 75. For example, the limiting member 71 may rotate about an axis parallel to a horizontal direction. For more detail, the limiting member 71 may rotate about an axis in the third direction D3 (see FIG. 3). The limiting member 71 may be upwardly spaced apart from the flange 11e. For example, a bottom surface 71b of the limiting member 71 may be spaced apart in the first direction D1 (see FIG. 3) from a top surface 11eu of the flange 11e. A range of about 1 mm to about 10 mm may be given as a spacing distance d1 between the bottom surface 71b of the limiting member 71 and the top surface 11eu of the flange 11e. The present inventive concepts, however, are not limited thereto. The locking tool 7 may prevent the oscillating vessel 11 from excessively bouncing upwardly. For example, even when resonance increases amplitude of the oscillating vessel 11, the locking tool 7 may prevent the amplitude from increasing beyond a predetermined limit. When the limiting member 71 of the locking tool 7 rotates outwardly, the oscillating vessel 11 may be separated and elevated from the resilient member (see 3 of FIG. 3), and as a result, it may be secured to obtain a space which will be elevated. A detailed description thereof will be further discussed below.

Figure 5:
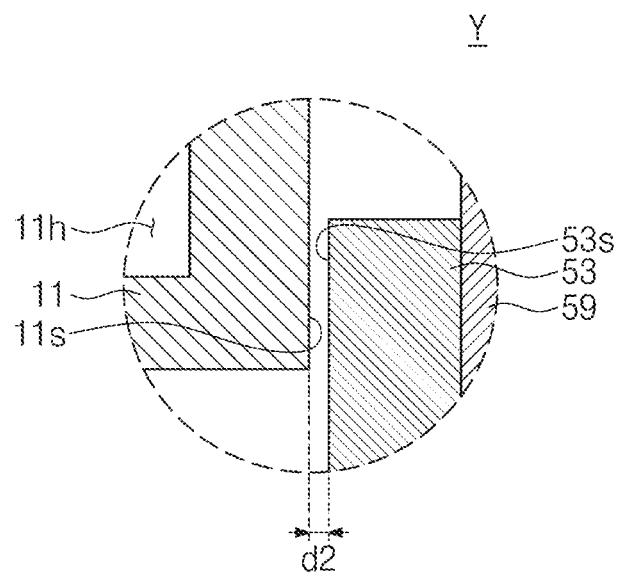
FIG. 5 illustrates an enlarged view showing section Y of FIG. 3.

FIG. 5 illustrates an enlarged view showing section Y of FIG. 3.

Referring to FIG. 5, the oscillating vessel 11 may be spaced apart in a horizontal direction from the spacing plate 53. For example, a lateral surface 11s of the oscillating vessel 11 may be spaced apart in the second direction D2 (see FIG. 3) from an inner surface 53s of the spacing plate 53. A value of about 0.1 mm or higher may be given as a spacing distance d2 between the lateral surface 11s of the oscillating vessel 11 and the inner surface 53s of the spacing plate 53. For example, a range of about 0.5 mm to about 2 mm may be given as the spacing distance d2 between the lateral surface 11s of the oscillating vessel 11 and the inner surface 53s of the spacing plate 53. When the spacing distance d2 is within the range discussed above, the oscillating vessel 11 may freely vibrate up and down without restriction from the spacing plate 53. In addition, when the spacing distance d2 is within the range discussed above, the oscillating vessel 11 may be inhibited (or, alternatively, prevented) from unnecessary (or, alternatively, undesired) movement in a horizontal direction during its vibration. For example, to effectively vibrate the solder ball (see Sb of FIG. 8), the oscillating vessel 11 may be required to vibrate in a horizontal movement range of about 0.5 m to about 2 mm. The present inventive concepts, however, are not limited thereto, and a different value range may be given as the spacing distance d2 between the lateral surface 11s of the oscillating vessel 11 and the inner surface 53s of the spacing plate 53.

Figure 6:
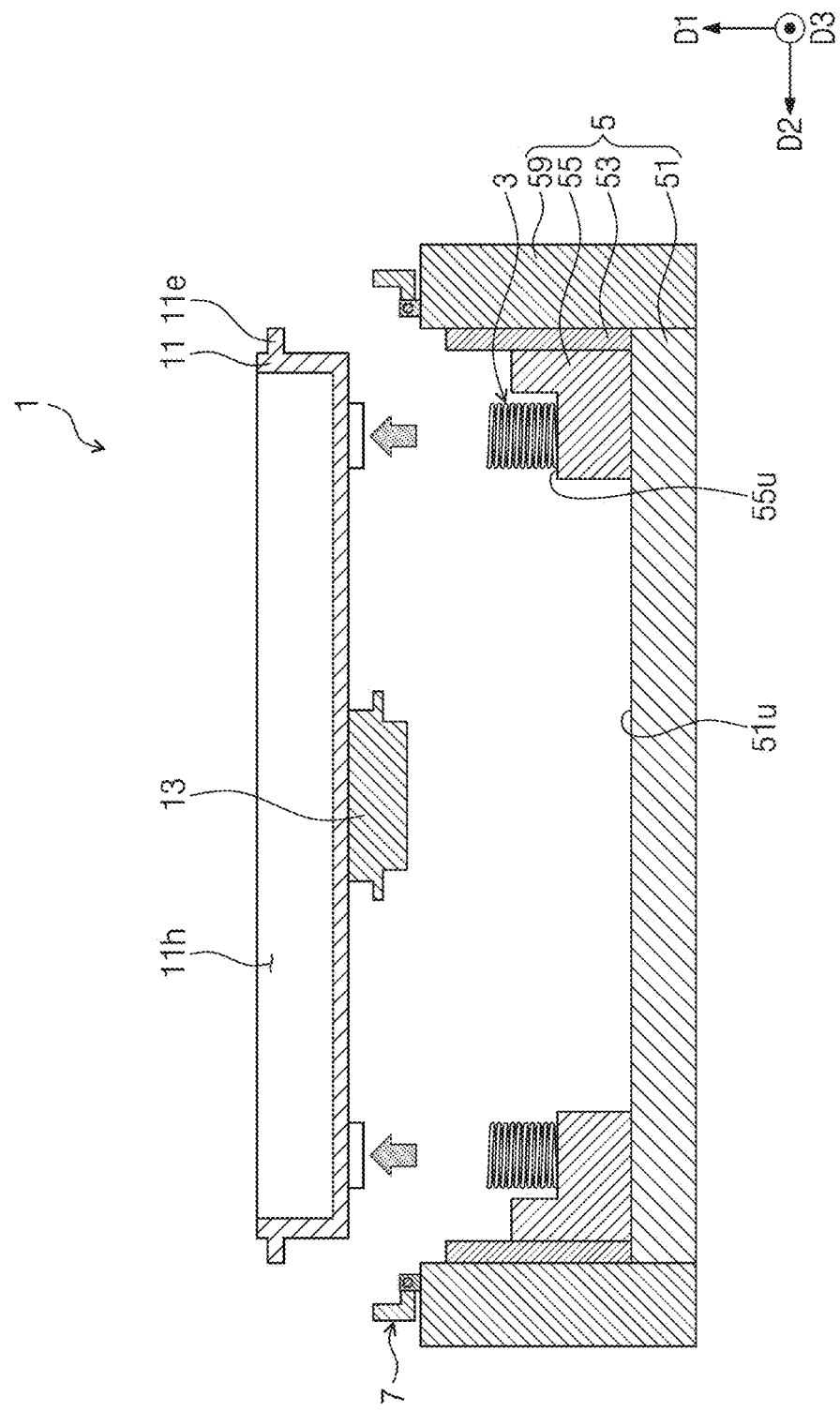
FIG. 6 illustrates an exploded cross-sectional view partially showing a ball jumping apparatus according to some example embodiments of the present inventive concepts.

FIG. 6 illustrates an exploded cross-sectional view partially showing a ball jumping apparatus according to some example embodiments of the present inventive concepts.

Referring to FIG. 6, the limiting member (see 71 of FIG. 4) of the locking tool 7 may rotate. The moving part 1 may ascend. For example, one or both of the oscillating vessel 11 and the oscillator 13 may be detachably attached. This manner may be used to replace one or both of the oscillating vessel and the oscillator 13.

Figure 7:
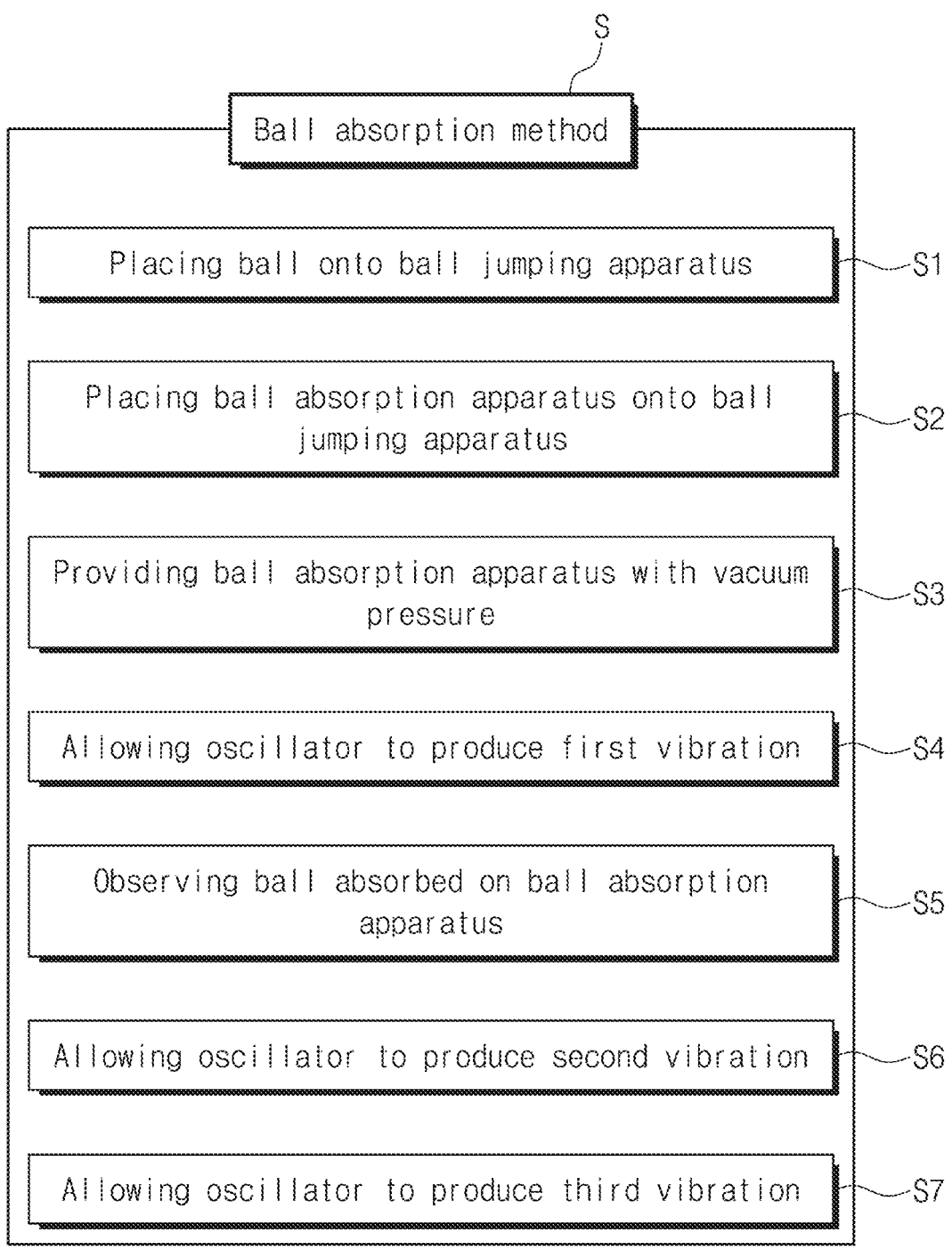
FIG. 7 illustrates a flow chart showing a ball absorption method according to some example embodiments of the present inventive concepts.

FIG. 7 illustrates a flow chart showing a ball absorption method according to some example embodiments of the present inventive concepts.

Referring to FIG. 7, a ball absorption method S may include an operation S1 of placing balls onto a ball jumping apparatus, an operation S2 of placing a ball absorption apparatus onto the ball jumping apparatus, an operation S3 of providing the ball absorption apparatus with a vacuum pressure, an operation of controlling an oscillator to produce a first vibration, an operation S5 of observing the balls absorbed on the ball absorption apparatus, an operation S6 of controlling the oscillator to produce a second vibration, and an operation S7 of controlling the oscillator to produce a third vibration.

The following will describe in detail each step of the ball absorption method S with reference to FIGS. 8 to 12.

FIGS. 8 to 12 illustrate cross-sectional views showing a ball jumping method according to some example embodiments of the present inventive concepts.

Figure 8:
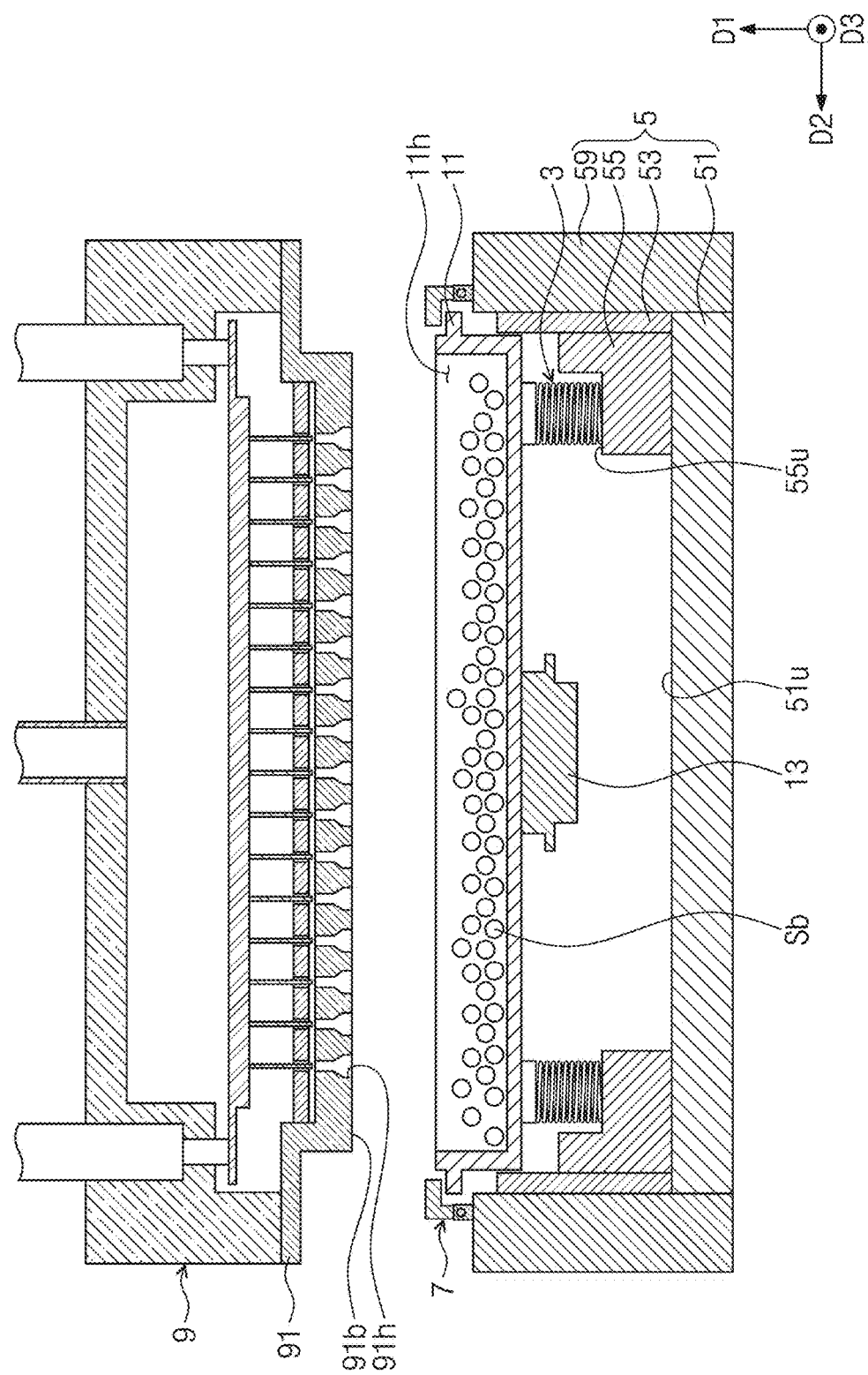
FIGS. 8 to 12 illustrate cross-sectional views showing a ball jumping method according to some example embodiments of the present inventive concepts.

Referring to FIGS. 7 and 8, the operation S1 may include placing the solder balls Sb into the ball receiving space 11h of the oscillating vessel 11. The solder balls Sb may indicate balls which will be bonded to a substrate or the like. The solder balls Sb may have various diameters. For example, the solder balls Sb may have their diameters of about 0.1 mm to about 0.3 mm. For more detail, the solder balls Sb may have their diameters of about 0.222 mm. The present inventive concepts, however, are not limited thereto, and differently sized solder balls Sb may be used.

An operation of S2 may include controlling a ball absorption apparatus 9 to move to a position on the ball jumping apparatus. In some example embodiments, the ball absorption apparatus 9 may be located at a height that is about 5 mm away from the ball jumping apparatus. After the ball absorption apparatus 9 absorbs the solder balls Sb, the ball absorption apparatus 9 may move and attach the solder balls Sb to a substrate or like. The ball absorption apparatus 9 may include an absorbing member 91. The absorbing member 91 may have an absorption hole 91h. The absorption hole 91h may be exposed on a bottom surface 91b of the absorbing member 91. In some example embodiments, the absorption hole 91h may be provided in plural. The plurality of absorption holes 91h may be spaced apart from each other in one or both of the second and third directions D2 and D3. For convenience of description, a single absorption hole 91h will be discussed below. The absorption hole 91h may be associated with a vacuum pump (not shown).

The operation S3 may include controlling the vacuum pump to provide the absorption hole 91h with a vacuum pressure. The vacuum pressure may absorb the solder ball Sb onto the absorption hole 91h. The vacuum pressure may cause the absorption hole 91h to rigidly hold the solder ball Sb.

Figure 9:
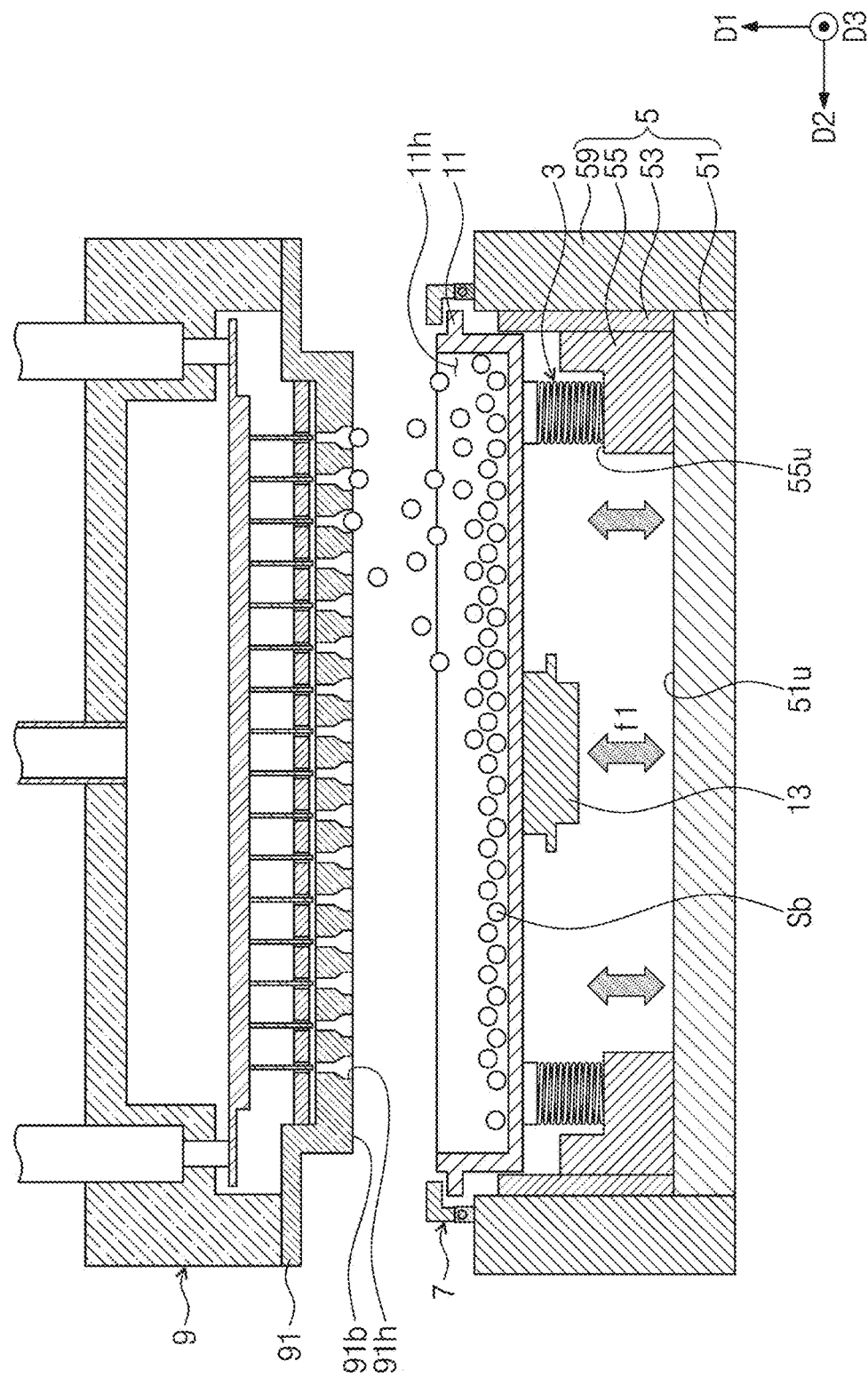

Referring to FIG. 9, the operation S4 may include supplying the oscillator 13 with a power to generate a first vibration from the oscillator 13. The power applied to the oscillator 13 may be an alternating voltage. For example, the power applied to the oscillator 13 may be a sine-wave alternating voltage. For more detail, the power applied to the oscillator 13 may be an alternating voltage of a single sine wave or overlapping two sine waves. In the first vibration, one side and other side of the oscillating vessel 11 may vibrate up and down at the same or similar amplitudes. The one side of the oscillating vessel 11 may mean a left side when viewed from FIG. 9. For example, the one side of the oscillating vessel 11 may indicate a left side of the oscillating vessel 11 in FIG. 9. The other side of the oscillating vessel 11 may mean a right side when viewed from FIG. 9. For example, the other side of the oscillating vessel 11 may indicate a right side of the oscillating vessel 11 in FIG. 9. To vibrate the one and other sides of the oscillating vessel 11 at the same amplitude, the oscillator 13 may vibrate at a frequency f1 by which all portions of the oscillating vessel 11 vibrate at the same or similar amplitudes. The frequency f1 may be called a regular frequency. The regular frequency f1 may be determined by various factors. For example, the regular frequency f1 may be determined by a diameter and weight of the solder ball Sb, a weight and shape of the oscillating vessel 11, a shape, number, and position of the resilient member 3, and a kind of the oscillator 13. The regular frequency f1 may be calculated under a specific condition. Alternatively, the regular frequency f1 may be experimentally determined under a specific condition. As the fixing part 5 does not restrict the moving part 1, the oscillating vessel 11 may be easy to uniformly vibrate. For example, because the oscillating vessel 11 and the oscillator 13 are spaced apart from and not in contact with the fixing part 5, there may be a reduction in the number of factors that determine the regular frequency f1. Therefore, because only the small number of factors is controlled to find the regular frequency f1, it may be easy to determine the regular frequency f1. In this case, because the fixing part 5 does not restrict the moving part 1, the oscillating vessel 11 may be easily controlled. When the oscillator 13 vibrates at the regular frequency f1, the one and other sides of the oscillating vessel 11 may uniformly vibrate.

When the oscillating vessel 11 vibrates in accordance with operation S4, the solder balls Sb may vibrate in the ball receiving space 11h. The solder balls Sb may upwardly bounce. One or more of the solder balls Sb may upwardly bounce to the vicinity of the absorption hole 91h. When the solder balls Sb vibrates at the regular frequency f1, the solder balls Sb may jump at a uniform height from the oscillating vessel 11. As the absorption hole 91h is provided with the vacuum pressure, the absorption hole 91h may absorb the solder ball Sb. In some example embodiments, the absorption of the solder balls Sb in accordance with the step S4 may occur more frequently at other side of the ball absorption apparatus 9 than at one side of the ball absorption apparatus 9. For example, when viewed from FIG. 9, the relatively greater number of the solder balls Sb may be absorbed on right-sided absorption holes 91h, and the relatively smaller number of the solder balls Sb may be absorbed on left-sided absorption holes 91h. Various factors may induce the irregular absorption of the solder balls Sb on the absorption holes 91h. For example, in the step S1, the relatively greater number of balls may be disposed on the right side of the ball receiving space 11h, which may result in the irregular absorption of the solder balls Sb. Moreover, the solder balls Sb may not be uniformly absorbed on the absorption holes 91h in the operation S4.

Figure 10:
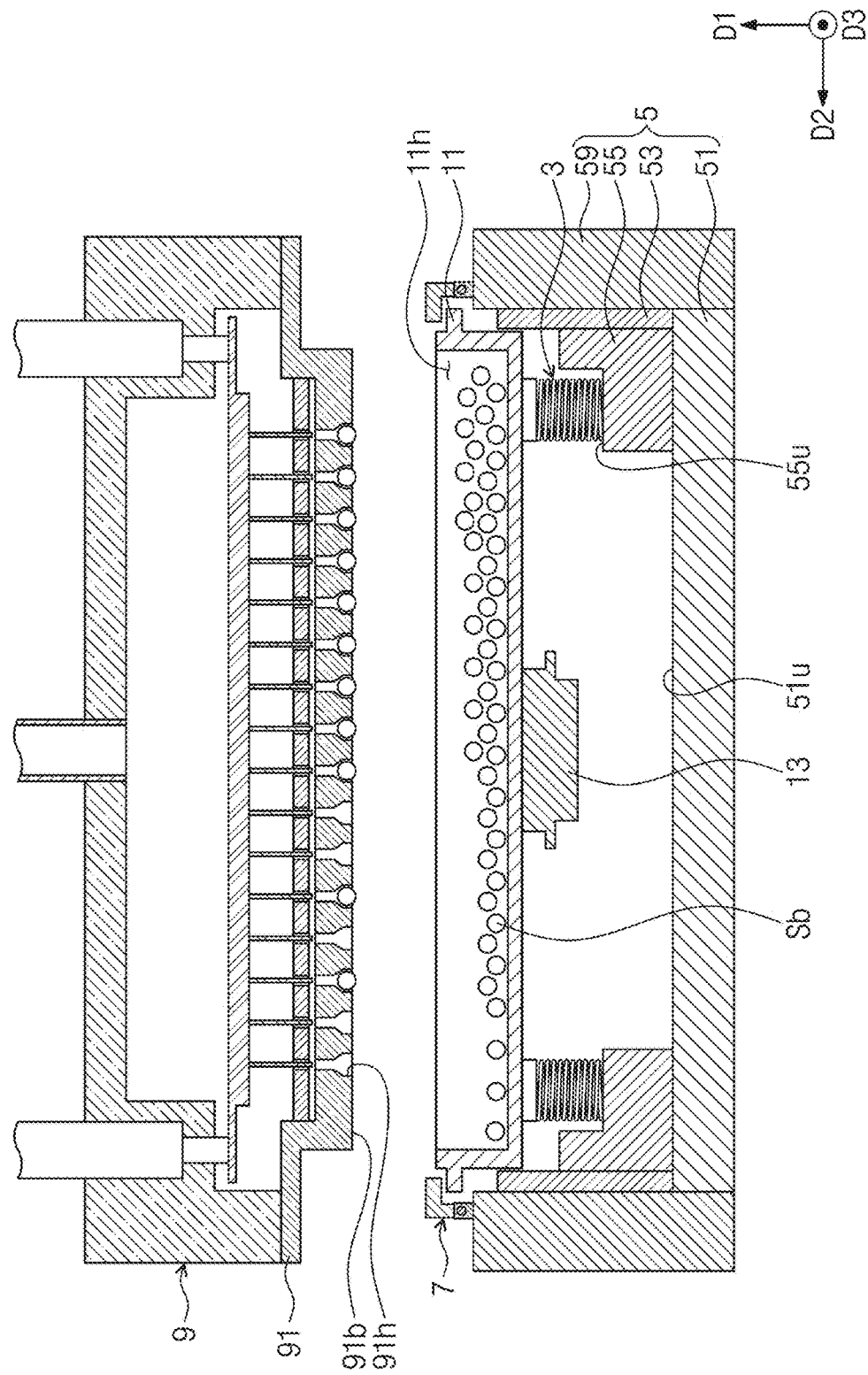

Referring to FIGS. 7 and 10, the operation S5 may include observing the bottom surface 91b of the ball absorption apparatus 9. Various methods may be performed to observe the bottom surface 91b of the ball absorption apparatus 9. For example, an observation camera (not shown) may capture the bottom surface 91b of the ball absorption apparatus 9. Alternatively, the bottom surface 91 of the ball absorption apparatus 9 may include sensors that sense and output a signal indicating whether the solder balls Sb are absorbed. Further still, the bottom surface 91b of the ball absorption apparatus 9 may be observed with the naked eye. When the solder balls Sb are not uniformly absorbed on the absorption holes 91h in operation S4, it may be possibly observed that large numbers of the solder balls Sb are absorbed on the right-sided absorption holes 91h, and that small numbers of the solder balls Sb are absorbed on the left-sided absorption holes 91h.

Figure 11:
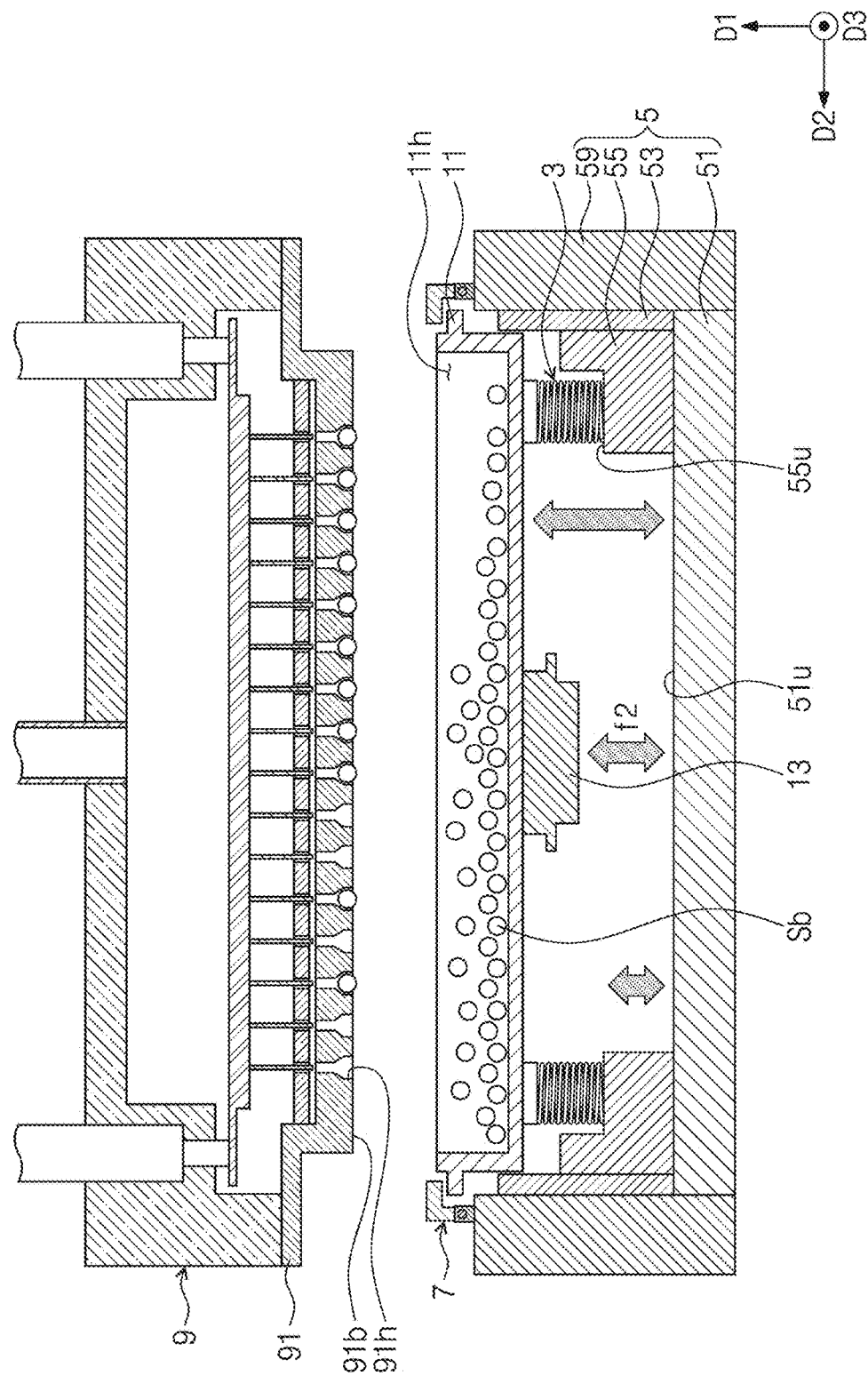

Referring to FIGS. 7 and 11, the operation S6 may include controlling the oscillator 13 to vibrate at an irregular frequency f2. The irregular frequency f2 may mean a frequency at which the one and other sides of the oscillating vessel 11 vibrate at different amplitudes. The irregular frequency f2 may be different from the regular frequency f1. The irregular frequency f2 may be determined by a method the same as or similar to that used for determining the regular frequency f1. For example, the irregular frequency f2 may be experimentally determined or calculated. At the irregular frequency f2, the oscillating vessel 11 may vibrate more intensely at its one side than at its other side. When the irregular frequency f2 causes the one side of the oscillating vessel 11 to vibrate more intensely than the other side of the oscillating vessel 11, the solder balls Sb may move in a horizontal direction toward the one side of the oscillating vessel 11. For example, the solder balls Sb may horizontally shift toward a location whose vibration level is low. When viewed from FIG. 11, the solder balls Sb may move toward the left side.

Figure 12:
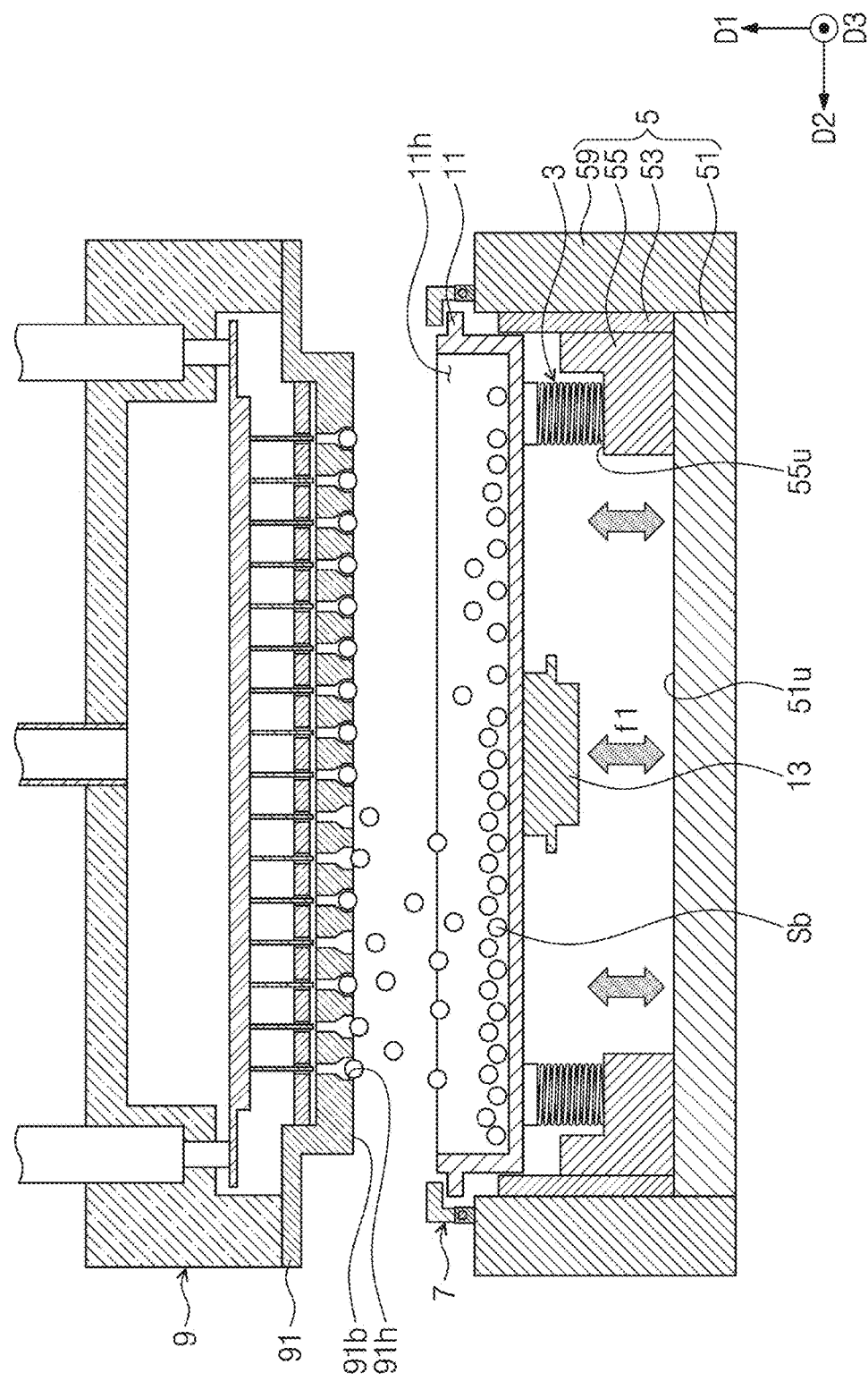

Referring to FIGS. 7 and 12, the operation S7 may include controlling the oscillator 13 to vibrate at the regular frequency f1. When the solder balls Sb are largely directed toward the one side of the oscillating vessel 11 in the step S6, the solder balls Sb may vibrate up and down at the one side of the oscillating vessel 11 in operation S7. The solder balls Sb may be absorbed on the absorption holes 91h present on the right side of the ball absorption apparatus 9. In this case, the solder balls Sb may be uniformly absorbed on all of the absorption holes 91h of the ball absorption apparatus 9.

One or more of operations S1 to S7 may be performed by a controller of the ball jumping apparatus J. For example, the controller may include processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a programmable logic unit, a microprocessor, application-specific integrated circuit (ASIC), etc.

The processing circuitry may be control an actuator to move the ball absorption apparatus 9 to move to the position on the ball jumping apparatus J, control a supply apparatus to supply the ball jumping apparatus with the solder balls Sb, control the vacuum pump to provide the absorption hole 91h with the vacuum pressure, control the oscillator 13 to produce the first to third vibrations and to generate the signals and/or control the sensors and/or observation camera to observe whether the balls are absorbed.

According to a ball jumping apparatus and a ball absorption method using the same in accordance with some example embodiments of the present inventive concepts, an oscillating vessel and an oscillator may be spaced apart from a fixing part. Therefore, neither the oscillating vessel nor the oscillator may be restricted by the fixing part. The oscillating vessel and the oscillator may vibrate freely. It may thus be easy to determine a frequency that controls the oscillating vessel. Accordingly, it may be possible to easily control vibration of the oscillating vessel.

According to a ball jumping apparatus and a ball absorption method using the same in accordance with some example embodiments of the present inventive concepts, solder balls may move in a horizontal direction in the oscillating vessel. Therefore, after the solder balls are absorbed on a ball absorption apparatus, the solder balls may move in a desired direction. Accordingly, the solder balls may be uniformly absorbed on the ball absorption apparatus. It may be possible to reduce a required time for absorption of the solder balls on all of the absorption holes in the ball absorption apparatus. Total working hours may be reduced.

According to a ball jumping apparatus and a ball absorption method using the same in accordance with some example embodiments of the present inventive concepts, the solder balls may be controlled to have appropriate jumping heights due to vibration of the oscillating vessel. The solder balls may thus be prevented from jumping excessively higher or lower. Therefore, the solder balls may be relatively promptly absorbed on the absorption holes. In addition, it may be possible to inhibit (or, alternatively, prevent) a bottom surface of an absorption member from damage caused by impact led by collision of the solder ball against the bottom surface of the absorption member. Accordingly, the bottom surface of the absorption member may be free of damage.

Figure 13:
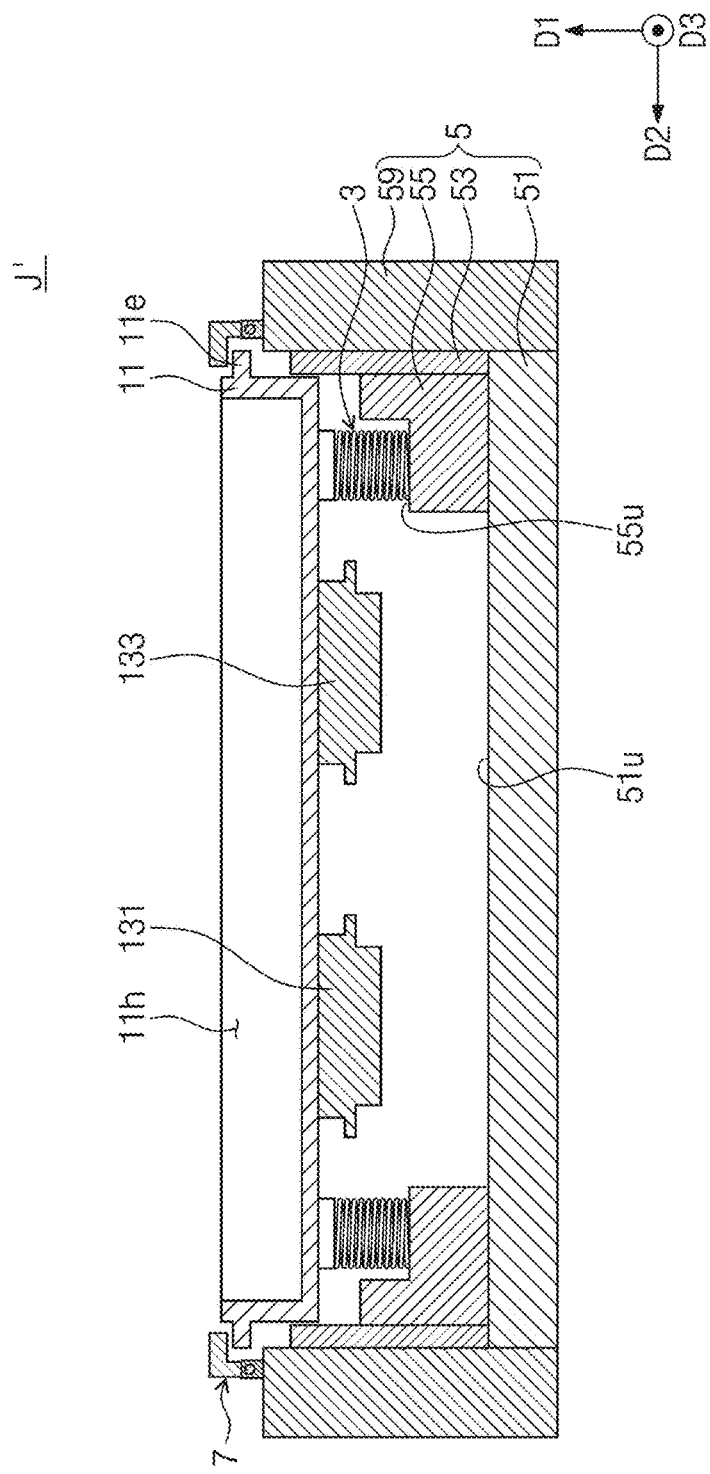
FIG. 13 illustrates a cross-sectional view showing a ball jumping apparatus according to some example embodiments of the present inventive concepts.
Figure 14:
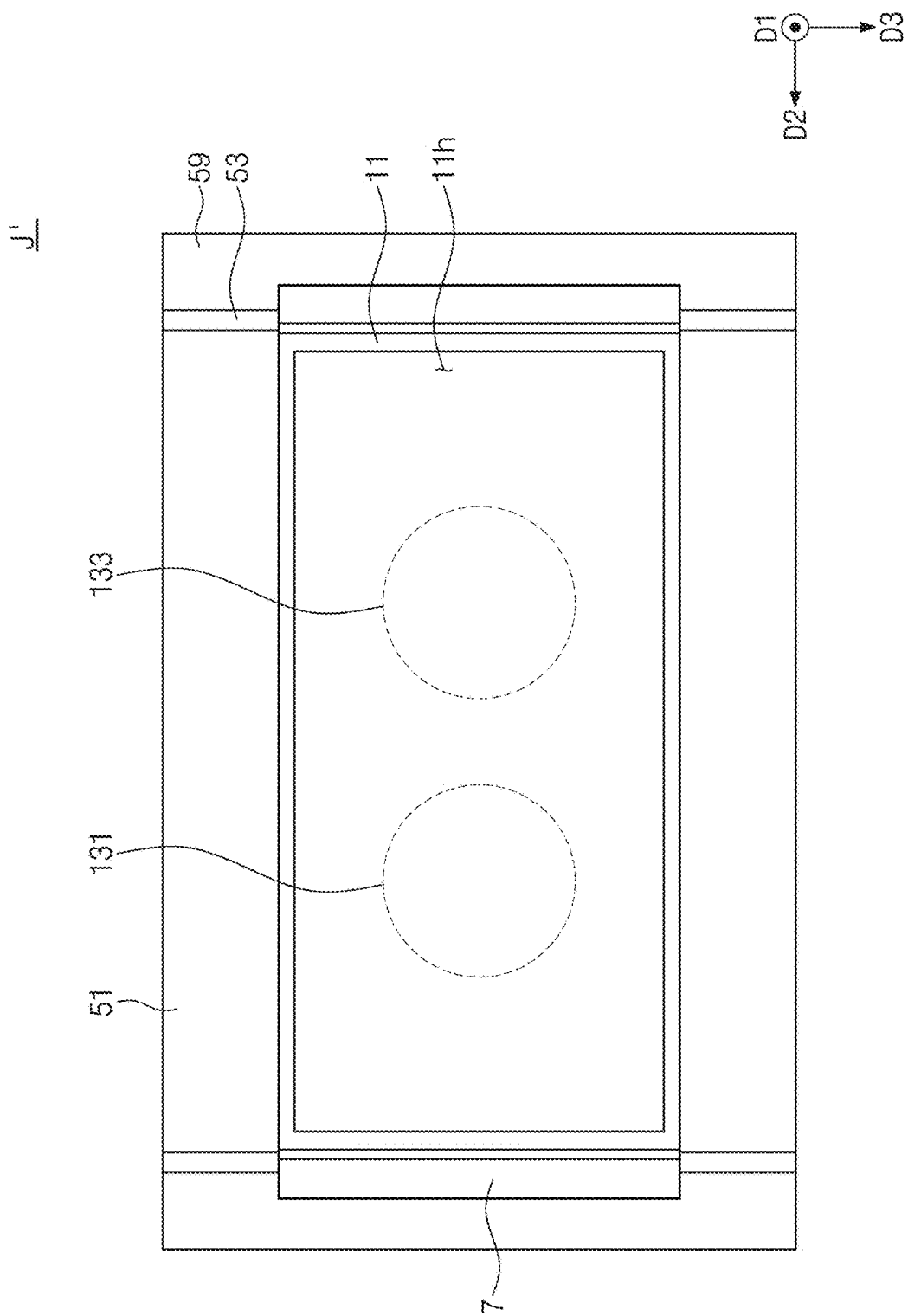
FIG. 14 illustrates a plan view showing a ball jumping apparatus according to some example embodiments of the present inventive concepts.

FIG. 13 illustrates a cross-sectional view showing a ball jumping apparatus according to some example embodiments of the present inventive concepts. FIG. 14 illustrates a plan view showing a ball jumping apparatus according to some example embodiments of the present inventive concepts.

For convenience of description below, omission will be made to avoid repetitive explanations of contents substantially the same as or similar to those discussed with reference to FIGS. 1 to 12.

Referring to FIGS. 13 and 14, a ball jumping apparatus J' may include a plurality of oscillators. For example, the ball jumping apparatus J' may include a first oscillator 131 and a second oscillator 133. The first oscillator 131 and the second oscillator 133 may be spaced apart from each other in the second direction D2. Owing to the two oscillators 131 and 133, the one and other sides of the oscillating vessel 11 may easily vibrate at different amplitudes.

Figure 15:
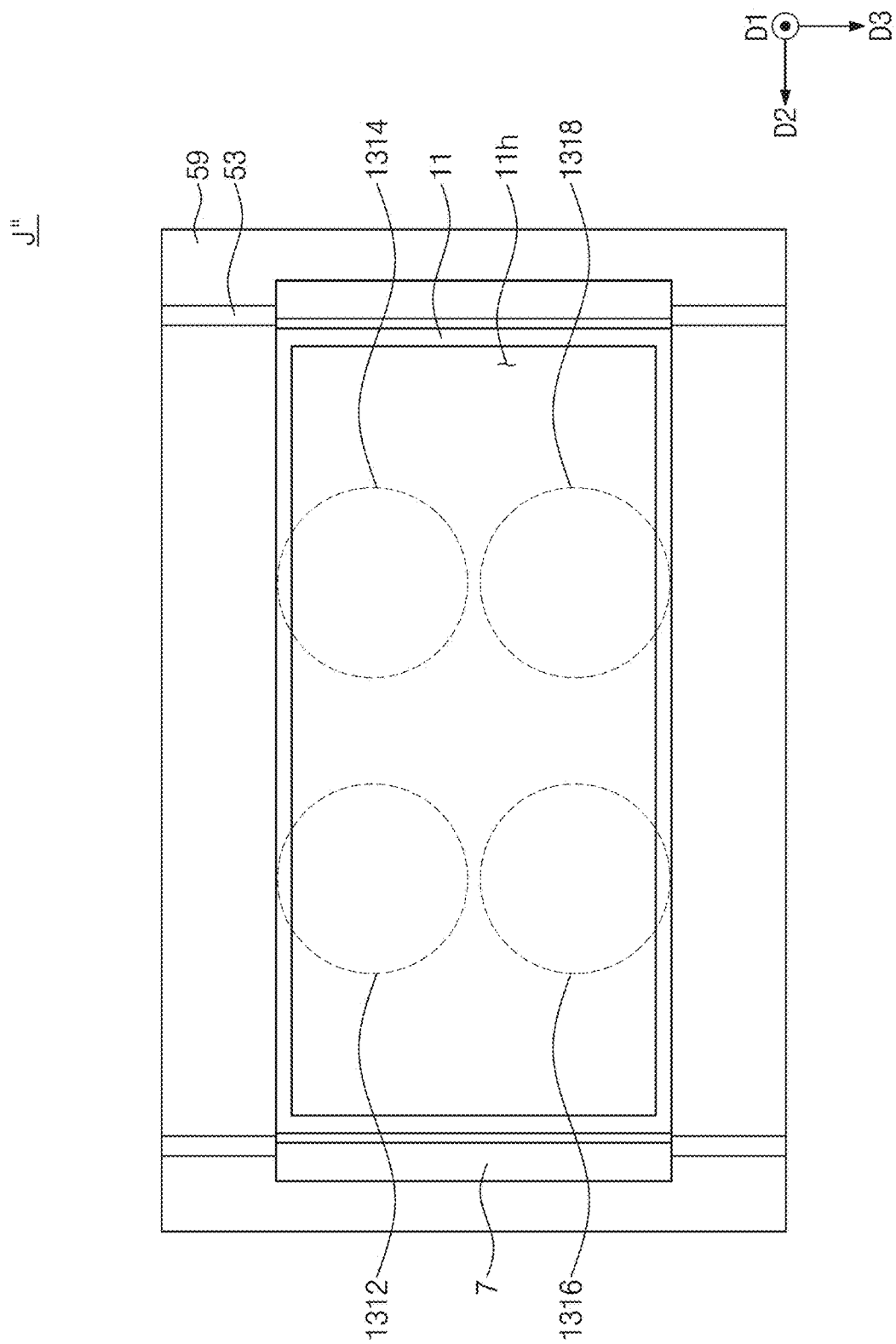
FIG. 15 illustrates a plan view showing a ball jumping apparatus according to some example embodiments of the present inventive concepts.

FIG. 15 illustrates a plan view showing a ball jumping apparatus according to some example embodiments of the present inventive concepts.

For convenience of description below, omission will be made to avoid repetitive explanations of contents substantially the same as or similar to those discussed with reference to FIGS. 1 to 14.

Referring to FIG. 15, a ball jumping apparatus J" may include four oscillators. For example, the ball jumping apparatus J" may include a first oscillator 1312, a second oscillator 1314, a third oscillator 1316, and a fourth oscillator 1318. The four oscillators 1312, 1314, 1316, and 1318 may be spaced apart from each other in the second direction D2 and the third direction D3. Owing to the four oscillators 1312, 1314, 1316, and 1318, the one and other sides of the oscillating vessel 11 may easily vibrate at different amplitudes.

Figure 16:
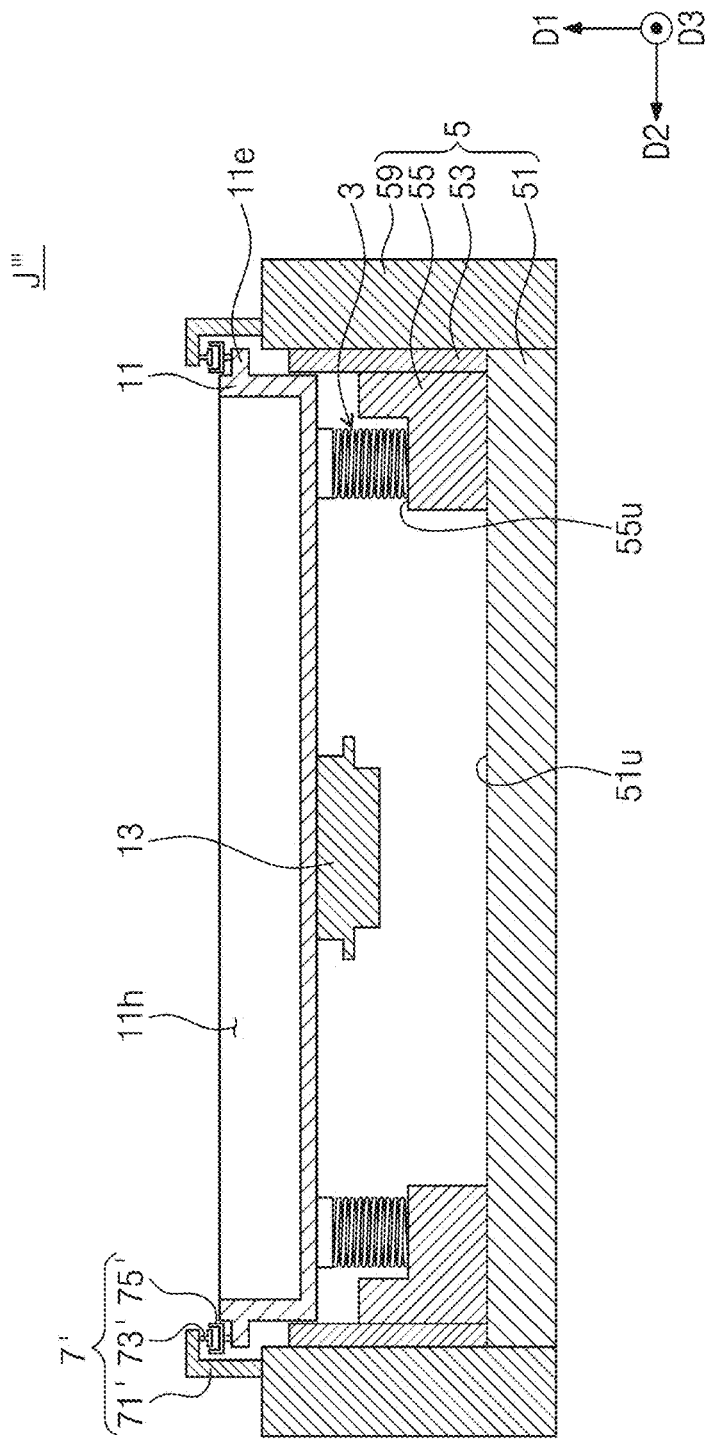
FIG. 16 illustrates a cross-sectional view showing a ball jumping apparatus according to some example embodiments of the present inventive concepts.

FIG. 16 illustrates a cross-sectional view showing a ball jumping apparatus according to some example embodiments of the present inventive concepts.

For convenience of description below, omission will be made to avoid repetitive explanations of contents substantially the same as or similar to those discussed with reference to FIGS. 1 to 15.

Referring to FIG. 16, a ball jumping apparatus J'" may include a damping tool 7'. The damping tool 7' may include a damping supporter 71', a first member 73', and a second member 75'. The damping supporter 71' may be coupled to the supporter 59. The first member 73' may be coupled to a lower side of the damping supporter 71'. The second member 75' may be coupled to the flange 11e. The first member 73' and the second member 75' may be collectively combined to constitute a damper. For example, the first member 73' may include a piston. The second member 75' may include a cylinder into which the piston is inserted. In addition, the first member 73' and the second member 75' may include other components capable of absorbing vibration. The damper may absorb vibration of the oscillating vessel 11. For example, the damper may prevent the oscillating vessel 11 from excessively upward movement caused by an increase in amplitude of the oscillating vessel 11. The damper may absorb impact of the oscillating vessel 11 that extraordinarily moves upwardly.

Figure 17:
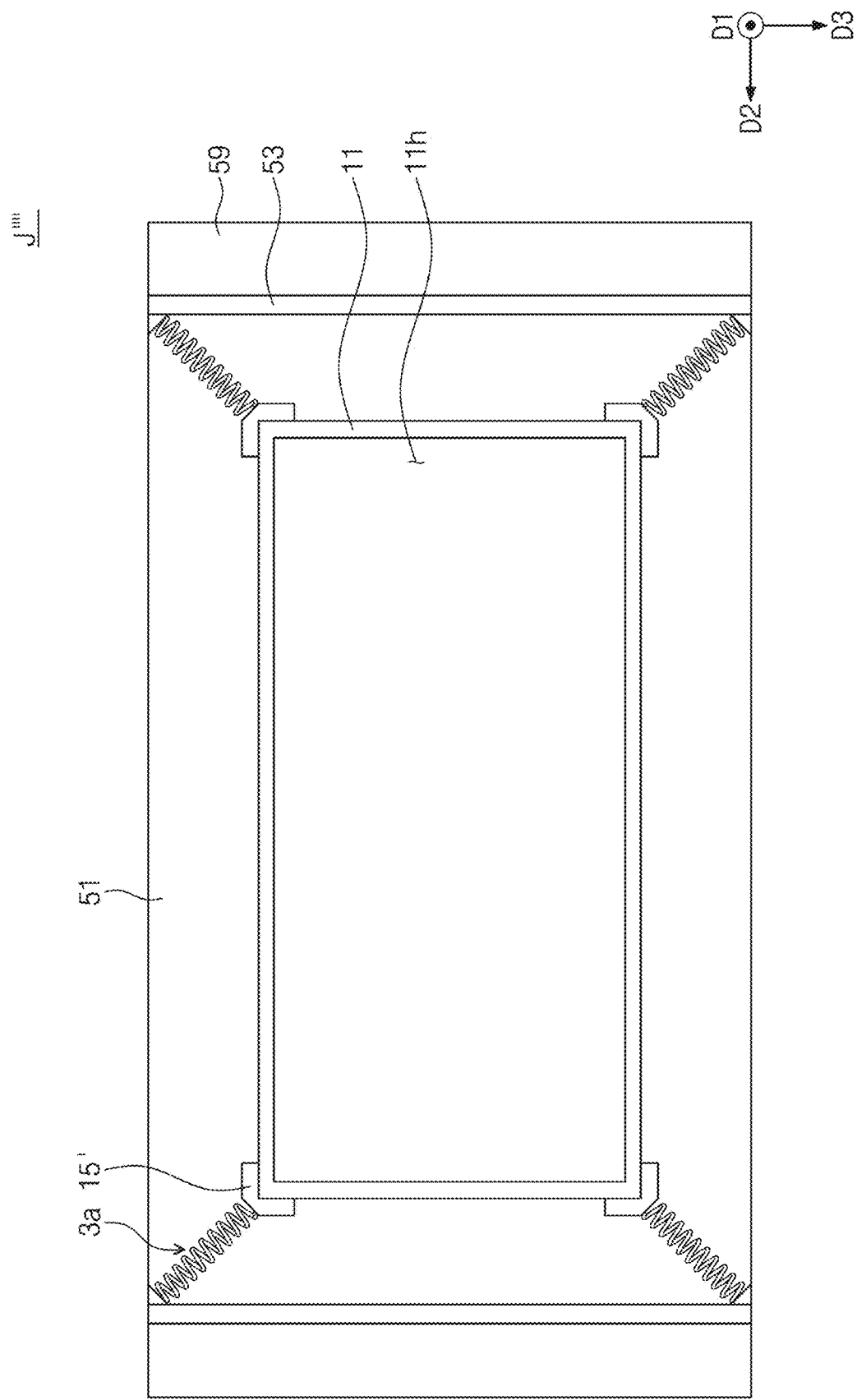
FIG. 17 illustrates a plan view showing a ball jumping apparatus according to some example embodiments of the present inventive concepts.
Figure 18:
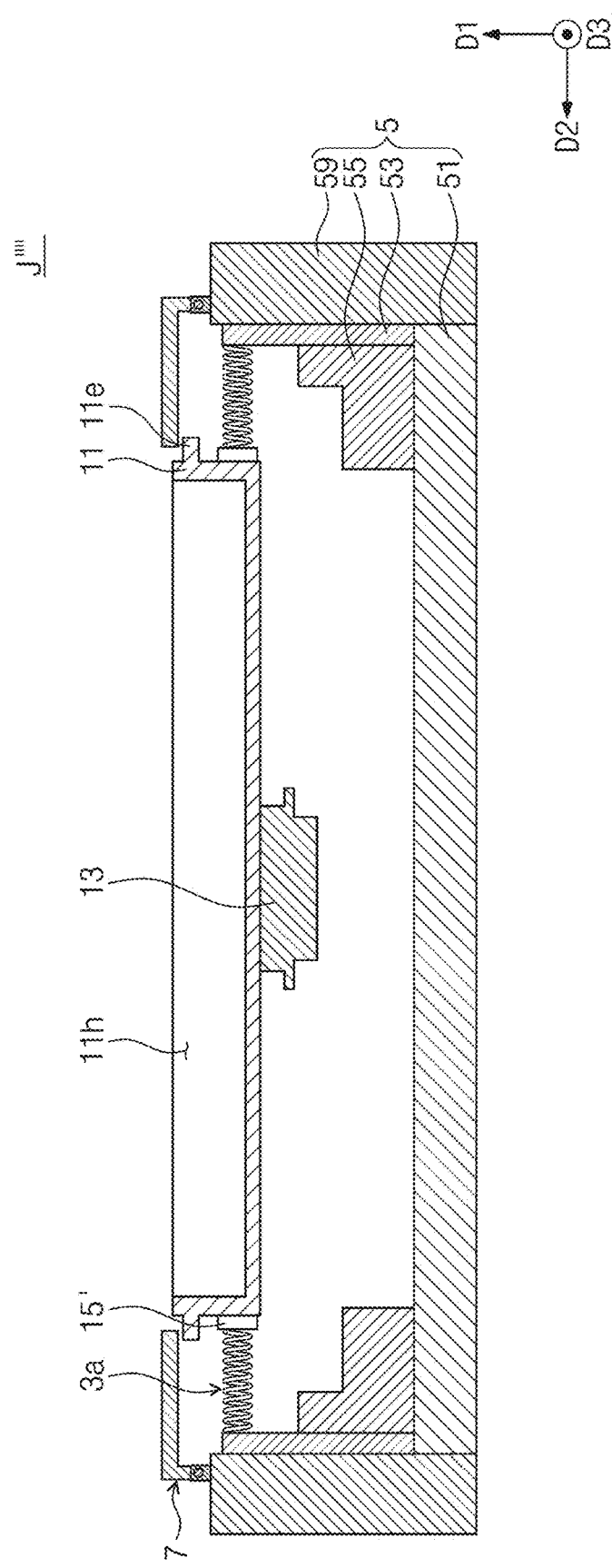
FIG. 18 illustrates a cross-sectional view showing a ball jumping apparatus according to some example embodiments of the present inventive concepts.

FIG. 17 illustrates a plan view showing a ball jumping apparatus according to some example embodiments of the present inventive concepts. FIG. 18 illustrates a cross-sectional view showing a ball jumping apparatus according to some example embodiments of the present inventive concepts.

For convenience of description below, omission will be made to avoid repetitive explanations of contents substantially the same as or similar to those discussed with reference to FIGS. 1 to 16.

Referring to FIGS. 17 and 18, a ball jumping apparatus J'''' may include a resilient member 3a coupled to the lateral surface of the oscillating vessel 11. For example, the resilient member 3a may extend in a horizontal direction from the spacing plate 53 and may have a connection with the lateral surface of the oscillating vessel 11. The resilient member 3a may be coupled to the oscillating vessel 11 through a connecting member 15' connected to the lateral surface of the oscillating vessel 11. The resilient member 3a may be provided in plural. For example, four resilient members 3a may be provided. For convenience of description, a single resilient member 3a will be discussed below. The resilient member 3a may connect the spacing plate 53 and the oscillating vessel 11 to each other. The resilient member 3a may vibrate up and down between the spacing plate 53 and the oscillating vessel 11. Therefore, the oscillating vessel 11 may move up and down.

Figure 19:
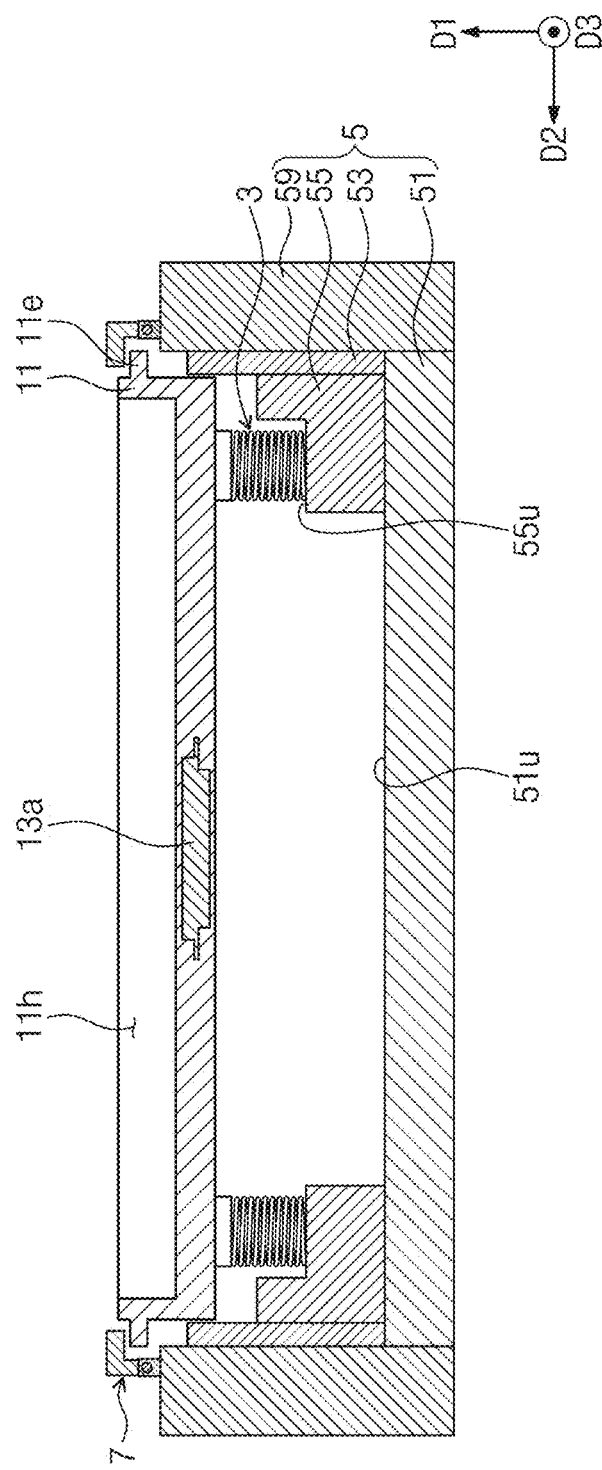
FIG. 19 illustrates a cross-sectional view showing a ball jumping apparatus according to some example embodiments of the present inventive concepts.

FIG. 19 illustrates a cross-sectional view showing a ball jumping apparatus according to some example embodiments of the present inventive concepts.

For convenience of description below, omission will be made to avoid repetitive explanations of contents substantially the same as or similar to those discussed with reference to FIGS. 1 to 18.

Referring to FIG. 19, the oscillating vessel 11 may have an oscillator 13a disposed therein. For example, the oscillator 13a may be positioned within a floor of the oscillating vessel 11. The oscillator 13a may vibrate within the oscillating vessel 11, thereby vibrating the oscillating vessel 11.

Figure 20:
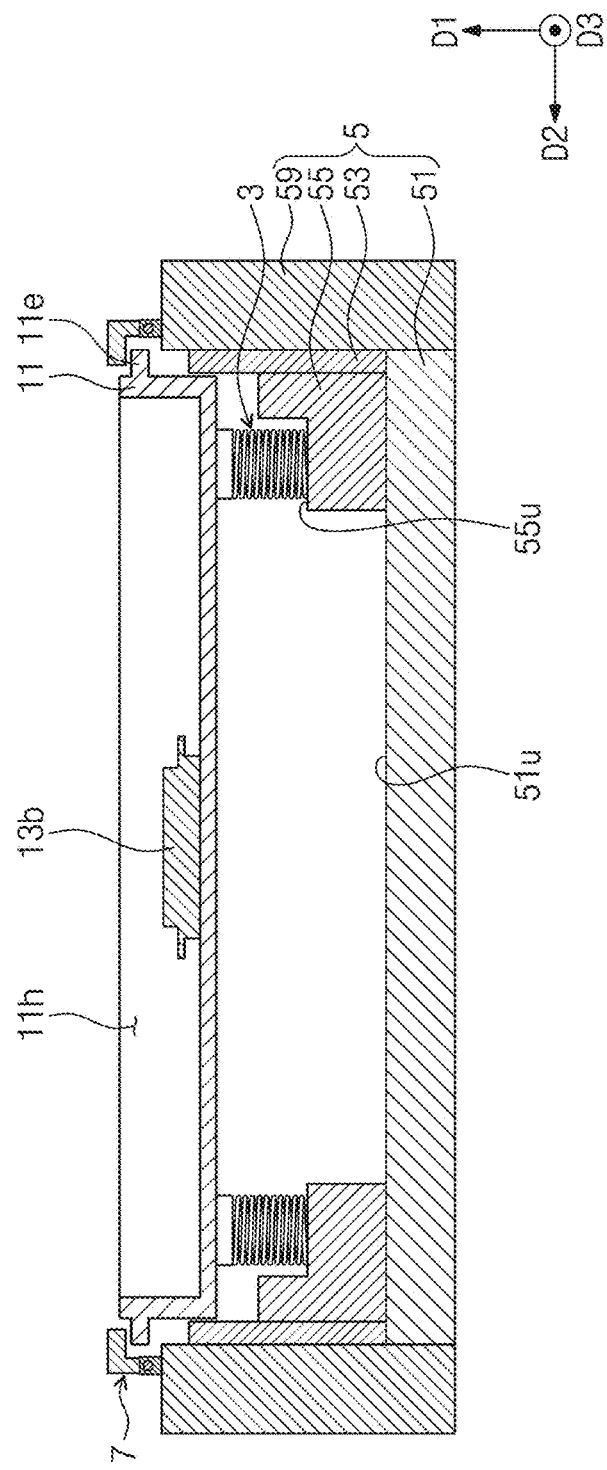
FIG. 20 illustrates a cross-sectional view showing a ball jumping apparatus according to some example embodiments of the present inventive concepts.

FIG. 20 illustrates a cross-sectional view showing a ball jumping apparatus according to some example embodiments of the present inventive concepts.

For convenience of description below, omission will be made to avoid repetitive explanations of contents substantially the same as or similar to those discussed with reference to FIGS. 1 to 19.

Referring to FIG. 20, the oscillating vessel 11 may have an oscillator 13b positioned on a top surface thereof. For example, the oscillator 13b may be disposed on a top surface that defines the ball receiving space 11h of the oscillating vessel 11. The oscillator 13b may vibrate while being coupled to the top surface of the oscillating vessel 11.

Figure 21:
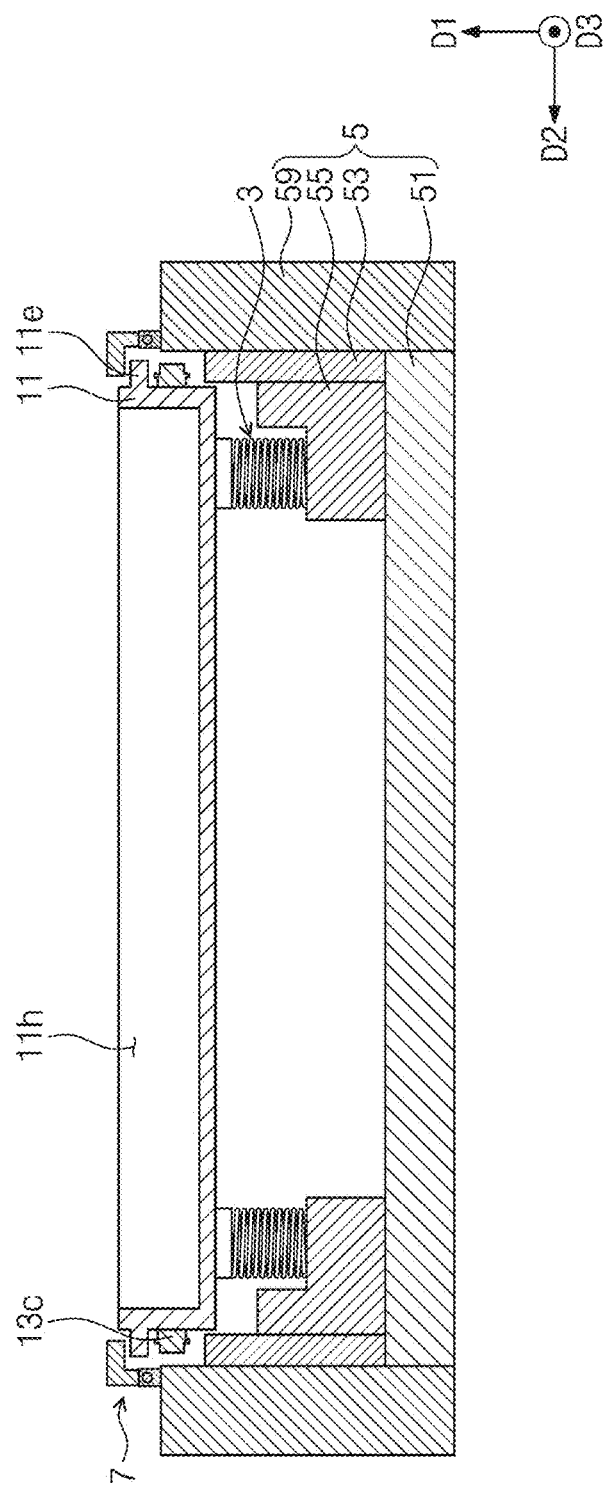
FIG. 21 illustrates a cross-sectional view showing a ball jumping apparatus according to some example embodiments of the present inventive concepts.

FIG. 21 illustrates a cross-sectional view showing a ball jumping apparatus according to some example embodiments of the present inventive concepts.

For convenience of description below, omission will be made to avoid repetitive explanations of contents substantially the same as or similar to those discussed with reference to FIGS. 1 to 20.

Referring to FIG. 21, the oscillating vessel 11 may have an oscillator 13c coupled to the lateral surface thereof. The oscillator 13c may be provided in plural. For example, two oscillators 13c may be connected to opposite lateral surfaces of the oscillating vessel 11. The two oscillators 13c may vibrate on the lateral surfaces of the oscillating vessel 11.

According to a ball jumping apparatus and a ball absorption method using the same of the present inventive concepts, a ball absorption apparatus may uniformly absorb solder balls.

According to a ball jumping apparatus and a ball absorption method using the same of the present inventive concepts, balls may be controlled in their movement in an oscillating vessel.

According to a ball jumping apparatus and a ball absorption method using the same of the present inventive concepts, a ball absorption apparatus may be prevented from damage.

According to a ball jumping apparatus and a ball absorption method using the same of the present inventive concepts, working hours may reduce.

Effects of the present inventive concepts are not limited to the mentioned above, other effects which have not been mentioned above will be clearly understood to those skilled in the art from the following description.

Although the present inventive concepts have been described in connection with some example embodiments of the present inventive concepts illustrated in the accompanying drawings, it will be understood to those skilled in the art that various changes and modifications may be made without departing from the technical spirit of the present inventive concepts. It therefore will be understood that the example embodiments described above are just illustrative but not limitative in all aspects.

What is claimed is:

1. A ball jumping apparatus, comprising:
   a fixing part including a fixing plate extending in a horizontal direction;
   a moving part including an oscillating vessel and an oscillator coupled to the oscillating vessel, the moving part being spaced apart from the fixing part with a gap between a bottom surface of the oscillating vessel and a top surface of the fixing plate, the oscillating vessel including a flange extending externally from a lateral surface of the oscillating vessel, the oscillating vessel configured to receive a ball in a ball receiving space thereof; and
   a resilient member configured to extend upward from the fixing part with the oscillating vessel floating on the resilient member such that an amount of vertical movement of the oscillating vessel is restrained by the flange interacting with a locking tool extending from the fixing part.

2. The ball jumping apparatus of claim 1, wherein the oscillator is coupled to the bottom surface of the oscillating vessel such that the oscillator is spaced apart from and above the fixing plate.

3. The ball jumping apparatus of claim 1, wherein the resilient member includes a coil spring coupled to the bottom surface of the oscillating vessel.

4. A ball jumping apparatus comprising:
   a fixing part including a fixing plate extending in a horizontal direction;
   a moving part including an oscillating vessel and an oscillator coupled to the oscillating vessel, the moving part being spaced apart from the fixing part with a gap between a bottom surface of the oscillating vessel and a top surface of the fixing plate, the oscillating vessel configured to receive a ball in a ball receiving space thereof; and
   a resilient member configured to extend upward from the fixing part to connect the fixing part and the moving part,
   wherein the fixing part further includes supporters and a spacing plate both extending in a vertical direction with the spacing plate being spaced apart in the horizontal direction from a lateral surface of the oscillating vessel.

5. The ball jumping apparatus of claim 4, wherein the spacing plate is spaced apart from the lateral surface of the oscillating vessel by 0.5 mm to 2 mm.

6. The ball jumping apparatus of claim 1, wherein the oscillator is coupled to a lateral surface of the oscillating vessel.

7. The ball jumping apparatus of claim 1, wherein the oscillator includes a plurality of oscillators.

8. The ball jumping apparatus of claim 1, wherein the locking tool includes,
   a connecting member fixed to the fixing part and extending upwardly; and
   a limiting member extending in the horizontal direction from the connecting member such that the limiting member is separated from a top surface of the flange.

9. The ball jumping apparatus of claim 8, wherein the limiting member is configured to rotate with respect to the connecting member about an axis parallel to the horizontal direction.

* * * * *

UNITED STATES PATENT AND TRADEMARK OFFICE
CERTIFICATE OF CORRECTION

| | | |
|---|---|---|
| PATENT NO. | : 11,511,363 B2 | Page 1 of 1 |
| APPLICATION NO. | : 17/216922 | |
| DATED | : November 29, 2022 | |
| INVENTOR(S) | : Sangkeun Ahn et al. | |

It is certified that error appears in the above-identified patent and that said Letters Patent is hereby corrected as shown below:

On the Title Page

(72) second Inventor should read: -- Hyeji Shin, Asan-si (KR) --

Signed and Sealed this
Eighteenth Day of July, 2023

Katherine Kelly Vidal
*Director of the United States Patent and Trademark Office*